US012002879B2

(12) United States Patent
Hwang et al.

(10) Patent No.: US 12,002,879 B2
(45) Date of Patent: Jun. 4, 2024

(54) HIGH ELECTRON MOBILITY TRANSISTOR AND METHOD OF MANUFACTURING THE SAME

(71) Applicant: Samsung Electronics Co., Ltd., Suwon-si (KR)

(72) Inventors: Sunkyu Hwang, Seoul (KR); Joonyong Kim, Seoul (KR); Jongseob Kim, Seoul (KR); Junhyuk Park, Pohang-si (KR); Boram Kim, Hwaseong-si (KR); Younghwan Park, Seongnam-si (KR); Dongchul Shin, Suwon-si (KR); Jaejoon Oh, Seongnam-si (KR); Soogine Chong, Seoul (KR); Injun Hwang, Yongin-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 229 days.

(21) Appl. No.: 17/098,896

(22) Filed: Nov. 16, 2020

(65) Prior Publication Data

US 2021/0399120 A1   Dec. 23, 2021

(30) Foreign Application Priority Data

Jun. 23, 2020 (KR) .......................... 10-2020-0076755

(51) Int. Cl.
*H01L 29/778* (2006.01)
*H01L 29/66* (2006.01)

(52) U.S. Cl.
CPC .... *H01L 29/7786* (2013.01); *H01L 29/66462* (2013.01); *H01L 29/7787* (2013.01)

(58) Field of Classification Search
CPC ............. H01L 29/7787; H01L 29/7786; H01L 29/66462
See application file for complete search history.

(56) References Cited

U.S. PATENT DOCUMENTS 8,569,769 B2   10/2013   Hwang et al.
8,598,628 B2   12/2013   Hikita et al.
(Continued)

FOREIGN PATENT DOCUMENTS

JP   2011014789 A   1/2011
KR   100842760 B1   7/2008
(Continued)

OTHER PUBLICATIONS

Smorchkova, I. P. "Polarization-induced charge and electron mobility in AlGaN/GaN heterostructures grown by plasma-assisted molecular-beam epitaxy" Jour. of App. Phys. vol. 86, No. 8 Oct. 15, 1999 pp. 4520-4526 (Year: 1999).*

(Continued)

*Primary Examiner* — Grant S Withers
(74) *Attorney, Agent, or Firm* — Harness, Dickey & Pierce, P.L.C.

(57) ABSTRACT

Provided is a high electron mobility transistor including: a channel layer comprising a 2-dimensional electron gas (2DEG); a barrier layer on the channel layer and comprising first regions and a second region, the first regions configured to induce the 2DEG of a first density in portions of the channel layer and the second region configured to induce the 2DEG of a second density different from the first density in other portions of the channel layer; source and drain electrodes on the barrier layer; a depletion formation layer formed on the barrier layer between the source and drain electrodes to form a depletion region in the 2DEG; and a gate electrode on the barrier layer. The first regions may include a first edge region and a second edge region corresponding to both ends of a surface of the gate electrode facing the channel layer.

24 Claims, 16 Drawing Sheets

(56) References Cited

U.S. PATENT DOCUMENTS

| | | | |
|---|---|---|---|
| 9,543,391 B2 | 1/2017 | Hwang et al. | |
| 2007/0224710 A1* | 9/2007 | Palacios | H01L 29/2003 |
| | | | 257/E29.253 |
| 2013/0099285 A1* | 4/2013 | Hwang | H01L 29/1608 |
| | | | 257/E29.246 |
| 2018/0294341 A1* | 10/2018 | Chen | H01L 29/42376 |
| 2020/0373383 A1* | 11/2020 | Zhang | H01L 29/7786 |
| 2021/0305416 A1* | 9/2021 | Teo | H01L 29/7786 |

FOREIGN PATENT DOCUMENTS

| | | |
|---|---|---|
| KR | 20120048244 A | 5/2012 |
| KR | 20130043047 A | 4/2013 |
| KR | 20130092752 A | 8/2013 |

OTHER PUBLICATIONS

Ki-Ha Hong et al., 'Effects of Oxygen Plasma Treatment on $V_{th}$ Uniformity of Recessed-Gate AlGaN/GaN HEMTs' *Electron. Mater. Lett.*, vol. 10, No. 2, 2014, pp. 363-367.

* cited by examiner

HIGH ELECTRON MOBILITY TRANSISTOR AND METHOD OF MANUFACTURING THE SAME

CROSS-REFERENCE TO RELATED APPLICATION

This application claims the benefit of Korean Patent Application No. 10-2020-0076755, filed on Jun. 23, 2020, in the Korean Intellectual Property Office, the disclosure of which is incorporated herein in its entirety by reference.

BACKGROUND

1. Field

The present disclosure generally relates to high electron mobility transistors and methods of manufacturing the same, and more particularly, to high electron mobility transistors, a threshold voltage of which is controlled by applying a specific structure to a boundary region between an active region and a field region, and methods of manufacturing the same.

2. Description of Related Art

In various power conversion systems, a device that controls the flow of current through ON/OFF switching, that is, a power device, is required. In a power conversion system, the efficiency of a power device may affect the efficiency of the entire system.

Currently, most commercially available power devices are silicon (Si)-based power metal-oxide-semiconductor field-effect transistors (MOSFETs) or insulated gate bipolar transistors (IGBTs). However, due to the limitation in physical properties of silicon and the limitation in manufacturing processes, it is difficult to increase the efficiency of Si-based power devices. In order to overcome the limitations, research/development has been underway to increase conversion efficiency by applying a Group III-V compound semiconductor to a power device. In this regard, high electron mobility transistors (Hereinafter, HEMTs) using a heterojunction structure of a compound semiconductor draw the attention.

An HEMT includes semiconductors having different electrical polarization characteristics from each other. In an HEMT, a semiconductor layer having a relatively large polarization rate may induce a 2-dimensional electron gas (Hereinafter, 2DEG) in another semiconductor layer contacted thereto. A 2DEG may have very high electron mobility. However, in order to utilize the HEMT usefully in various electronic devices, it is necessary to appropriately improve/control its characteristics. In particular, it is necessary to improve/control an ON-current level, a threshold voltage, etc. of the HEMT.

SUMMARY

Provided are high electron mobility transistors (Hereinafter, HEMTs) having a hump-free current-voltage characteristic according to an embodiment.

Provided are methods of manufacturing a high electron mobility transistor that has improved current-voltage characteristics according to an embodiment.

Additional aspects will be set forth in part in the description which follows and, in part, will be apparent from the description, or may be learned by practice of the presented embodiments of the disclosure.

According to an aspect of an embodiment, a high electron mobility transistor includes a channel layer comprising a 2-dimensional electron gas (2DEG); a barrier layer on the channel layer and comprising first regions and a second region, the first regions on portions of the channel layer and configured to induce the 2DEG of a first density in portions of the channel layer and the second region on other portions of the channel layer and configured to induce the 2DEG of a second density different from the first density; source and drain electrodes on the barrier layer; and a gate electrode on the barrier layer between the source and drain electrodes. The first regions may include a first edge region and a second edge region corresponding to both ends of a surface of the gate electrode contacting the channel layer.

In some embodiments, the first density of the 2DEG is less than the second density of the 2DEG.

In some embodiments, the high electron mobility transistor may further include an insulating film between the barrier layer and the gate electrode.

In some embodiments, the high electron mobility transistor may further include a depletion formation layer between the barrier layer and the gate electrode. The depletion formation layer may be configured to form a depletion region in the 2DEG.

In some embodiments, the source and drain electrodes may extend parallel to each other in a first direction, and the gate electrode may extend in the first direction parallel to the source and drain electrodes.

In some embodiments, both ends of a surface of the gate electrode contacting the channel layer are both ends of the gate electrode in the first direction.

In some embodiments, the gate electrode may include protrusions at both ends thereof extending in the first direction.

In some embodiments, the barrier layer may include second protrusions extending in the first direction and the second protrusions may correspond to the protrusions of the gate electrode.

In some embodiments, the barrier layer may include recesses in the first edge region and the second edge region.

In some embodiments, the recesses may have a depth greater than 0 nm and less than 100 nm.

In some embodiments, the depth of the recesses may be the same as the thickness of the barrier layer.

In some embodiments, the recess may have a width as the same as that of the gate electrode.

In some embodiments, a shape of the recesses may be configured to simultaneously form a channel in the first region and the second region of the channel layer in response to applying a same threshold voltage to the gate electrode.

In some embodiments, at least one of depletion formation layer and the gate electrode may include protrusions at both ends thereof extending in the first direction.

In some embodiments, the barrier layer may include second protrusions extending in the first direction to correspond to the protrusions of the gate electrode.

In some embodiments, the first edge region and the second edge region of the barrier layer may be regions doped with anions.

In some embodiments, the anions may include any one of fluorine ions $F^-$ and oxygen ions $O^{2-}$.

In some embodiments, the depletion formation layer may include a p-type Group III-V nitride semiconductor.

In some embodiments, the barrier layer may include any one of AlGaN, AlInN, InGaN, AlN, and AlInGaN.

According to an aspect of an embodiment, a method of manufacturing a high electron mobility transistor includes: forming a barrier layer on a channel layer; forming first regions and a second region on the barrier layer, the first regions configured to induce a 2DEG of a first density in portions of the channel layer and the second region configured to induce a 2DEG of a second density different from the first density in other portions of the channel layer; forming source and drain electrodes on the barrier layer; and forming a gate electrode on the barrier layer between the source and drain electrodes. The first regions may include a first edge region and a second edge region corresponding to both ends of a surface of the gate electrode contacting the channel layer.

In some embodiments, the method may further include forming an insulating film between the barrier layer and the gate electrode.

In some embodiments, the method may further include forming a depletion formation layer on the barrier layer to form a depletion region in the 2DEG on the barrier layer.

In some embodiments, the method may further include forming an insulating film on the depletion formation layer; forming a hole in the insulating film by patterning portions of the insulating film; and forming the gate electrode on the insulating film to cover the hole.

In some embodiments, the gate electrode, the source electrode, and drain electrode may be formed to extend parallel to each other in the first direction.

In some embodiments, both ends of a surface of the gate electrode contacting the channel layer are both ends of the surface in the first direction.

In some embodiments, the forming the first regions and the second region on the barrier layer may include forming recesses in the first edge region and the second edge region of the barrier layer.

In some embodiments, the forming the first regions and the second region on the barrier layer may further include forming a recess in a region of the barrier layer between the first edge region and the second edge region.

In some embodiments, the forming the first regions and the second region on the barrier layer may include doping anions at both ends of a surface of the gate electrode contacting the channel layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
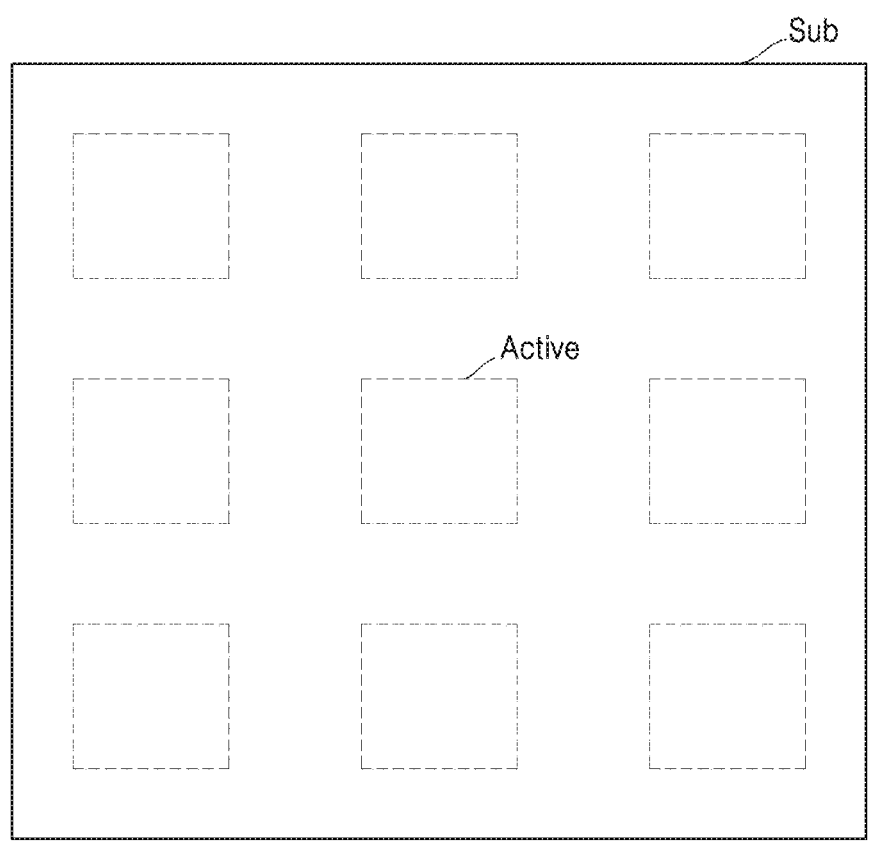
FIG. 1 is a schematic diagram illustrating a plurality of active regions provided on a substrate Sub.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a high electron mobility transistor (HEMT) and a method of manufacturing the same will be described in detail with reference to the accompanying drawings. In the drawings, like reference numerals refer to the like elements, and sizes or thicknesses of constituent elements may be exaggerated for clarity and convenience of explanation. The following embodiments described below are merely illustrative, and various modifications may be possible from the embodiments of the present disclosure.

It will be understood that when an element or layer is referred to as being "on" or "above" another element or layer, the element or layer may be directly on another element or layer or intervening elements or layers. As used herein, the singular forms "a," "an" and "the" are intended to include the plural forms as well, unless the context clearly indicates otherwise. It should be understood that, when a part "comprises" or "includes" an element in the specification, unless otherwise defined, other elements are not excluded from the part and the part may further include other elements The term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

It will be understood that, although the terms "first", "second", etc. may be used herein to describe various elements, the elements should not be limited by these terms. These terms are only used to distinguish one element from another element. An HEMT and a method of manufacturing the same may be implemented in various different forms and are not limited to the embodiments described herein.

An HEMT includes semiconductor layers having different electrical polarization characteristics. In an HEMT, a semiconductor layer having a relatively large polarization rate may induce a 2DEG in another semiconductor layer contacted thereto, and the 2DEG may have very high electron mobility.

On the other hand, when a gate voltage is 0 V in an HEMT, the HEMT is in a normally-on state in which current flows due to low resistance between the drain electrode and the source electrode, and in this case, current and power consumption may occur, and in order to turn off the current between the drain electrode and the source electrode, there is a problem that a negative voltage must be applied to the gate electrode. As a method of solving the problem, a depletion formation layer may be provided in the HEMT, and thus, when a gate voltage is 0 V, a normally-off characteristic in which the current between the drain electrode and the source electrode is off may be implemented.

Figure 2:
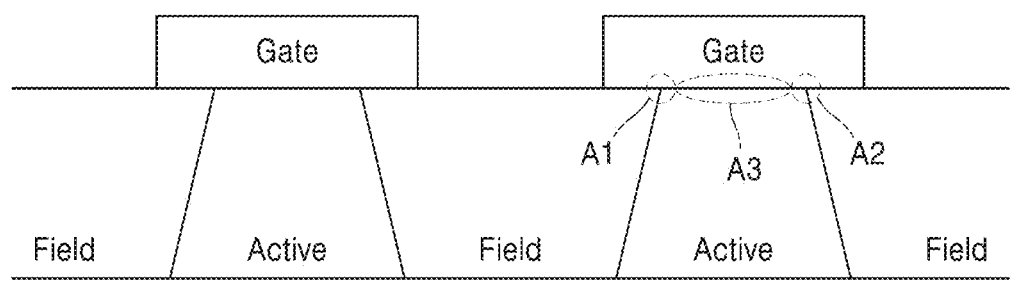
FIG. 2 is a diagram briefly illustrating a structure including gate electrodes provided on the plurality of active regions of FIG. 1.
Figure 2:
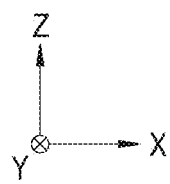
Figure 3:
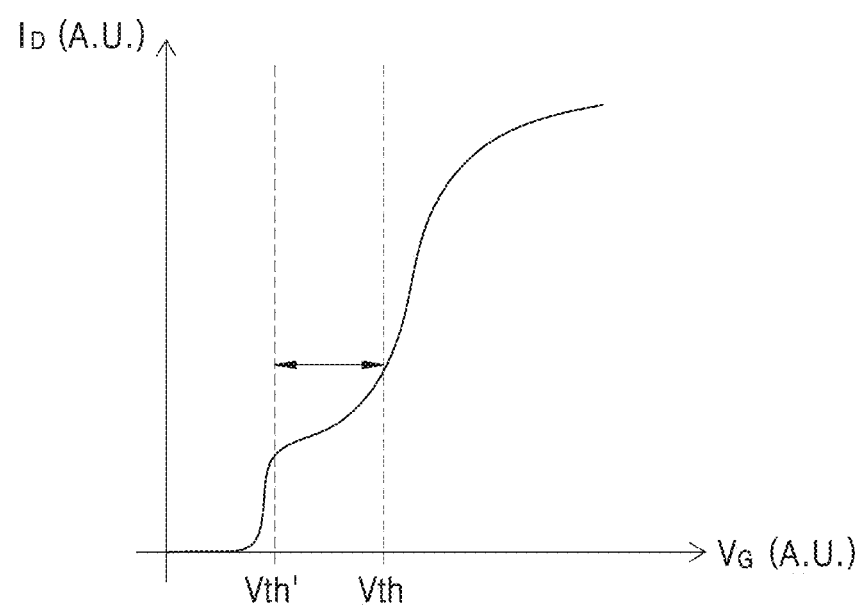
FIG. 3 is a graph schematically showing drain current and gate voltage characteristics of a transistor to which the structure of FIG. 2 is applied.

FIG. 1 is a schematic diagram showing a plurality of active regions Active on a substrate Sub. FIG. 2 is a diagram briefly illustrating a structure including gate electrodes Gate provided on the plurality of active regions Active of FIG. 1. FIG. 3 is a graph schematically showing drain current $I_D$ and gate voltage $V_G$ characteristics of a transistor to which the structure of FIG. 2 is applied.

Referring to FIG. 1, the active region Active included in an HEMT 1000 (refer to FIG. 4) according to an embodiment may be formed on the substrate Sub. The active region Active may be a region in which a channel is formed. For example, a plurality of active regions Active separated from each other may be formed on the substrate Sub. For example, the plurality of active regions Active may be arranged in two dimensions by being separated from each other, in a first direction (X-axis direction) and a second direction (Y-axis direction) on the substrate Sub.

Referring to FIG. 2, the plurality of active regions Active may be electrically isolated from each other by field regions Field. For example, the field regions Field may include an insulating material. However, the present embodiment is not limited thereto, and the field regions Field may be regions formed on the substrate Sub through an argon gas or nitrogen gas treatment. A gate electrode Gate may be provided on each active region Active. Regions close to the field region Field at an interface between the active region Active and the gate electrode Gate may be referred to as edge regions A1 and A2. In addition, a region between the edge regions A1 and A2 at the interface between the active region Active and the gate electrode Gate may be referred to as a central region A3. As described above, a transistor having a structure in which a gate electrode Gate is provided on a plurality of active regions Active electrically isolated by field regions Field may be manufactured. When a gate voltage is applied to the gate electrode Gate included in the transistor, a gate electric field may be distributed to the central region A3 less than the edge regions A1 and A2.

Referring to FIG. 3, due to the non-uniform distribution of the gate electric field between the edge regions A1 and A2 and the central region A3, there may be a hump in the characteristics graph of the drain current $I_D$ and gate voltage $V_G$ of the transistor. For example, even when the drain current $I_D$ does not flow to the central region A3 because the gate electric field is distributed to the edge regions A1 and A2 more than the central region A3, the drain current $I_D$ may begin to flow to the edge regions A1 and A2. In other words, when applying a gate voltage to the gate electrode Gate while increasing the gate voltage, a channel through which the drain current ID flows may be formed earlier in the edge regions A1 and A2 than in the central region A3 of the active region Active. Accordingly, the transistor may have a first threshold voltage $V_{th}'$ and a second threshold voltage $V_{th}$. In this way, when the transistor has the first threshold voltage $V_{th}'$ and the second threshold voltage $V_{th}$, it may be difficult to design operating characteristics of the transistor as desired, and thus, it may be difficult to apply the transistor to a power device. Therefore, it is necessary to implement a transistor having a drain current $I_D$ and a gate voltage $V_G$ with the hump removed.

Hereinafter, an HEMT according to an embodiment showing improved operating characteristics will be described.

Figure 4:
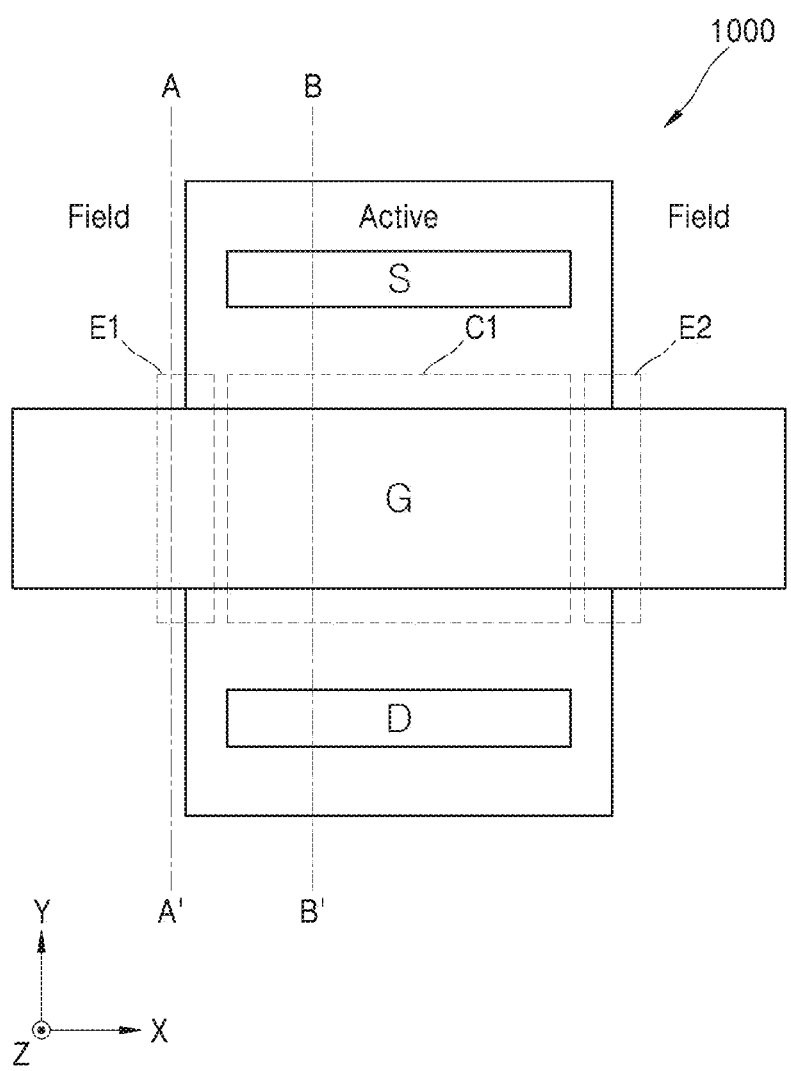
FIG. 4 is a schematic plan view of a configuration of a high electron mobility transistor (HEMT) according to an embodiment.
Figure 5:
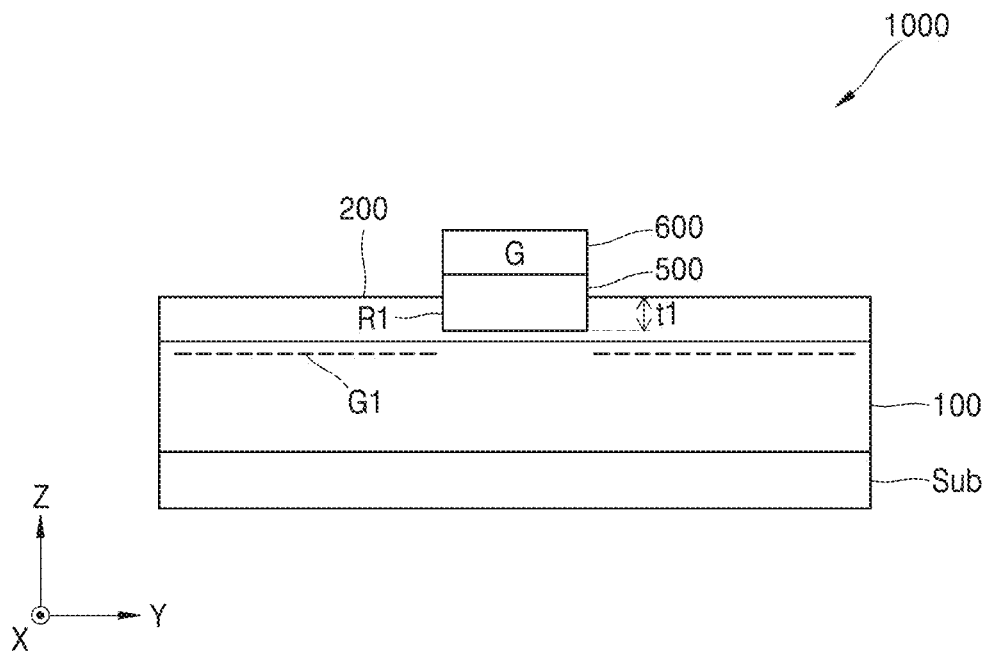
FIG. 5 is a brief side cross-sectional view taken along line A-A' of FIG. 4 showing a configuration of a side cross-section of the HEMT of FIG. 4.
Figure 6:
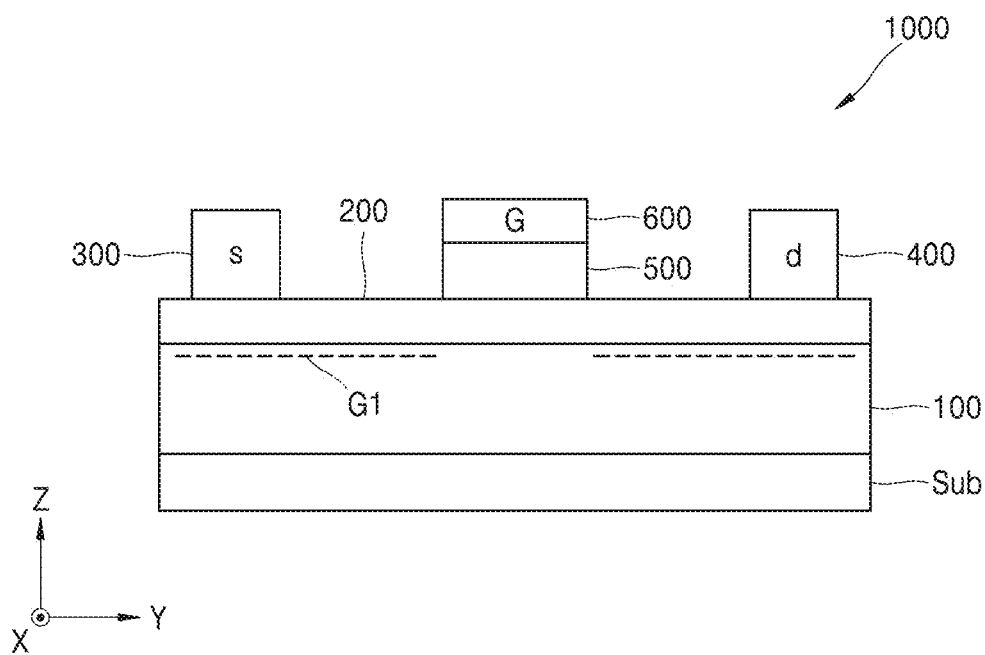
FIG. 6 is a brief side cross-sectional view taken along line B-B' of FIG. 4 showing a configuration of a side cross-section of the HEMT of FIG. 4.

FIG. 4 is a schematic plan view of a configuration of an HEMT 1000 according to an embodiment. FIG. 5 is a brief side cross-sectional view taken along line A-A' of the HEMT 1000 of FIG. 4. FIG. 6 is a brief side cross-sectional view taken along line B-B' of the HEMT 1000 of FIG. 4

Referring to FIG. 4, the HEMT 1000 may include a gate electrode G provided on an active region Active surrounded by a field region Field. In addition, the HEMT 1000 may include a source electrode S and a drain electrode D separated from each other with the gate electrode G therebetween on the active region Active. For example, the source electrode S, the drain electrode D, and the gate electrode G may all be formed to extend parallel to each other in the first direction (X-axis direction). Also, the source electrode S, the drain electrode D, and the gate electrode G may be sequentially arranged in the second direction (Y-axis direction). For example, the source electrode S and the drain electrode D may be provided separated from each other in the second direction (Y-axis direction) with the gate electrode G therebetween.

The gate electrode G may be formed to extend in the first direction (X-axis direction) and protrude into the field region Field. For example, the gate electrode G may include protrusions at both ends invading the field region Field by protruding from the active region Active in the first direction (X-axis direction). In this case, a region on which a portion of the gate electrode G is in a desired and/or alternatively predetermined region including an interface between the active region Active and the field region Field may be referred to as first regions E1 and E2. The first regions E1 and E2 may include a first edge region E1 and a second edge region E2.

The first edge region E1 and the second edge region E2 may be regions corresponding to both ends of a surface of the active region Active contacting the gate electrode G in the first direction (X-axis direction). As described later, a channel layer may be provided in the active region Active. Accordingly, the first edge region E1 and the second edge region E2 may be regions corresponding to both ends of a surface of the channel layer contacting the gate electrode G in the first direction (X-axis direction). A region where another part of the gate electrode G is disposed in a region between the first edge region E1 and the second edge region E2 may be referred to as a second region C1. The second region C1 may be referred to as a central region. The first regions E1 and E2 may be substantially the same as the edge regions A1 and A2 of FIG. 2. Also, the second region C1 may be substantially the same as the central region A3 of FIG. 2.

As described above, when a gate voltage is applied to the gate electrode G, electric fields distributed to the first regions E1 and E2 and the second region C1 below the gate electrode G may be different from each other. For example, even when the same gate voltage is applied to the gate electrode G, the electric field applied to the first regions E1 and E2 may be greater than the electric field applied to the second region C1. In this way, a phenomenon in which a further stronger electric field is formed at a boundary between the active region Active and the field region Field below the gate electrode G may be referred to as a gate edge effect. Due to the gate edge effect, it may be difficult to design the driving characteristics of the transistor as desired.

Referring to FIGS. 5 and 6, the HEMT 1000 may include a channel layer 100 including 2DEG G1, a barrier layer 200 provided on the channel layer 100, source and drain electrodes 300 and 400 provided on the barrier layer 200, a depletion formation layer 500 that is configured to form a depletion region in the 2DEG G1 and provided on the barrier layer 200 between the source and drain electrodes 300 and 400, and a gate electrode 600 provided on the depletion formation layer 500. However, the present embodiment is not limited thereto, and in some cases, the HEMT 1000 may not include the depletion formation layer 500. In this case, the gate electrode 600 may be provided to directly contact the barrier layer 200.

The channel layer 100 may be provided on the substrate Sub. The region where the channel layer 100 is formed may correspond to the active region Active of FIG. 4. The substrate Sub may include, for example, sapphire, Si, SiC, GaN, etc. However, the substrate Sub is not limited thereto and may include various materials. The channel layer 100 may include a semiconductor layer. The channel layer 100 may include a Group III-V compound semiconductor. For example, the channel layer 100 may include a GaN-based material (for example, GaN). In this case, the channel layer 100 may be an undoped GaN layer, but in some cases, may be a GaN layer doped with a desired and/or alternatively predetermined impurity. Although not shown in FIGS. 5 & 6, a desired and/or alternatively predetermined buffer layer may be provided between the substrate Sub and the channel layer 100. The buffer layer may be provided to prevent deterioration of the crystallinity of the channel layer 100 by mitigating the difference in lattice constant and thermal expansion coefficient between the substrate Sub and the channel layer 100. The buffer layer may have a single-layer or multi-layer structure including one or more materials selected from nitrides including at least one of Al, Ga, In, and B. As a specific example, the buffer layer may have a single-layer or multi-layer structure including at least one of various materials including AlN, GaN, AlGaN, InGaN, AlInN, AlGaInN, etc. In some cases, a desired and/or alternatively predetermined seed layer (not shown in FIGS. 5 & 6) may further be provided between the substrate Sub and the buffer layer. The seed layer may be a base layer for the growth of the buffer layer.

The barrier layer 200 may be a semiconductor layer different from the channel layer 100. The barrier layer 200 may be a layer that is configured to induce a 2DEG G1 in the channel layer 100. The 2DEG G1 may be formed in the channel layer 100 portion below an interface between the channel layer 100 and the barrier layer 200. The barrier layer 200 may include a material (semiconductor material) having a different polarization characteristic, and/or energy bandgap, and/or lattice constant from the channel layer 100. The barrier layer 200 may include a material (semiconductor material) having a greater polarization rate and/or energy band gap than the channel layer 100. For example, the barrier layer 200 may have a single-layer or multi-layer structure including one or more materials selected from nitrides including at least one of Al, Ga, In, and B. For example, the barrier layer 200 may have a single-layer or multi-layer structure including at least one of various materials including AlGaN, AlInN, InGaN, AlN, AlInGaN, etc. The barrier layer 200 may be an undoped layer, but may also be a layer doped with a desired and/or alternatively predetermined impurity. The thickness of the barrier layer 200 may be tens of nm or less. For example, the thickness of the barrier layer 200 may be about 50 nm or less.

The thickness of the barrier layer 200 may be non-uniform according to regions. The barrier layer 200 includes first regions (refer to E1 and E2 of FIG. 4) that is configured to induce 2DEG G1 of a first density in a portion of the channel layer 100 and a second region (refer to C1 in FIG. 4) that is configured to induce 2DEG G1 having a second density different from the first density in the remaining portions of the channel layer 100. For example, the thickness of the barrier layer 200 in the first regions E1 and E2 may be less than the thickness in the second region C1.

Referring to FIGS. 4 and 5, the barrier layer 200 may include recesses R1 in the first regions E1 and E2. For example, the recesses R1 may be provided in each of the first edge region E1 and the second edge region E2. The recess R1 may have a depth t1 greater than 0 nm and less than several tens of nm. For example, the depth t1 of the recess R1 may be greater than 0 nm and less than 100 nm. For example, the depth t1 of the recess R1 may be greater than 0 nm and less than 30 nm. Also, for example, the recess R1 may have a depth t1 in a range from about 5 nm to about 25 nm. However, the present embodiment is not limited thereto, and the depth t1 of the recess R1 may be less than 5 nm or greater than 25 nm. In addition, the depth t1 of the recess R1 may be the same as the thickness of the barrier layer 200. For example, the recess R1 may be formed as much as the thickness of the barrier layer 200 by etching the barrier layer 200 of the first edge region E1 and the second edge region E2. The structure of the recess R1 will be described later with reference to FIGS. 7 and 8. The depletion formation layer 500 may be provided on the recess R1.

Referring to FIGS. 4 and 6, the second region C1 of the barrier layer 200 may have a flat structure. In other words, a recess may not be provided in the second region C1 of the barrier layer 200. However, the present embodiment is not limited thereto, and recesses may also be formed in some regions of the second region C1.

As such, because the barrier layer 200 has different thicknesses according to the first regions E1 and E2 and the second region C1, the density of the 2DEG G1 formed in the channel layer 100 may be non-uniform. For example, a first density of the 2DEG G1 of the first regions E1 and E2 of the channel layer 100 may be less than a second density of the 2DEG G1 of the second region C1. This is because the density of the 2DEG G1 formed in the channel layer 100 increases as the thickness of the barrier layer 200 on the channel layer 100 increases. Furthermore, as described above, when recesses are formed in some regions of the second region C1, 2DEGs G1 having different densities may be formed according to regions within the second region C1.

The source electrode 300 and the drain electrode 400 may be formed on a region of the barrier layer 200 where the depletion formation layer 500 is not formed. The source electrode 300 and the drain electrode 400 may face each other with the first regions E1 and E2 and the second region C1 therebetween.

Although not shown in the drawings, the source electrode 300 and the drain electrode 400 may be formed on the channel layer 100 by removing portions of the barrier layer 200 formed under the source electrode 300 and the drain electrode 400. This case may also be applied to other embodiments to be described below.

The depletion formation layer 500 may include a p-type semiconductor material. That is, the depletion formation layer 500 may be a semiconductor layer doped with a p-type impurity. The depletion formation layer 500 may include a Group III-V based nitride semiconductor. The depletion formation layer 500 may include a material doped with a p-type impurity in at least one of, for example, GaN, AlGaN, InN, AlInN, InGaN, and AlInGaN. As a specific example, the depletion formation layer 500 may include a p-GaN layer.

Because the depletion formation layer 500 may increase an energy bandgap of a portion of the barrier layer 200 therebelow, a depletion region of a 2DEG G1 may be formed in a portion of the channel layer 100 corresponding to the depletion formation layer 500. Accordingly, the portion of the 2DEG G1 corresponding to the depletion formation layer 500 may be disconnected or have different characteristics (e.g., electron concentration, etc.) from the remaining portions of the 2DEG G1. The region where the 2DEG G1 is disconnected may be referred to as a "disconnected region", and, due to the disconnected region, the HEMT 1000 may have a normally-off characteristic in which a current between a drain electrode and a source electrode is in an off-state when a gate voltage is 0 V. When a gate voltage is applied to the gate electrode 600, a channel may be formed in the disconnected region. As described above, the concentrations of 2DEG G1 in the first regions E1 and E2 and the second regions C1 of the channel layer 100 may be different from each other. In addition, the magnitudes of electric fields distributed to the first regions E1 and E2 and the second region C1 may be different due to a gate edge effect. In this way, the concentration of 2DEG G1 in the first regions E1 and E2 may be different from that of the second region C1 of the channel layer 100. The concentration of 2DEG G1 with respect to the first regions E1 and E2 and the second region C1 of the channel layer 100 may be appropriately controlled by controlling the thickness of the barrier layer 200. Accordingly, when a voltage is applied to the gate electrode 600, a channel may be simultaneously formed in the first regions E1 and E2 and the second region C1 of the channel layer 100 at the same threshold voltage.

Figure 7:
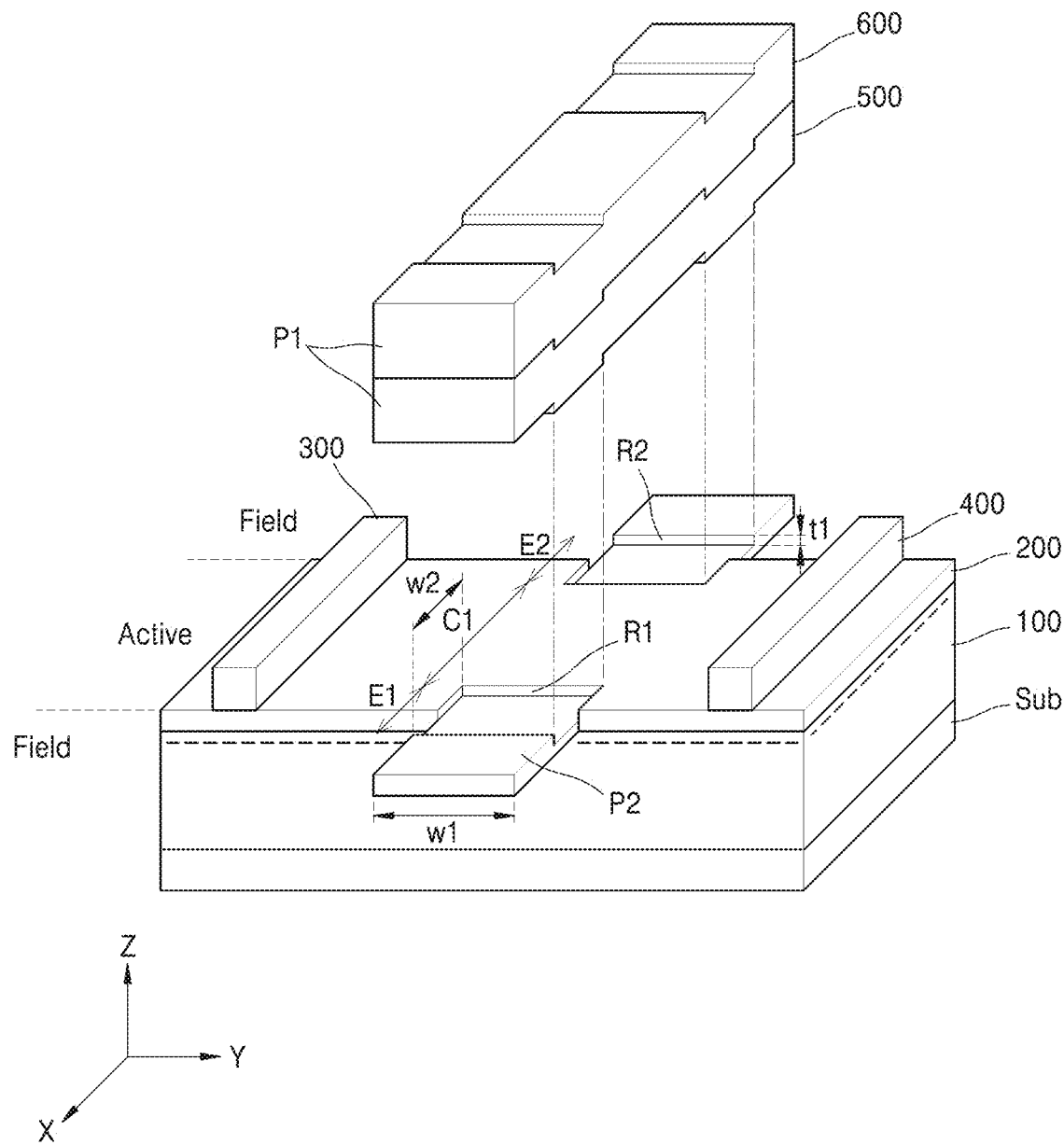
FIG. 7 is an exploded perspective view showing a simplified configuration of the HEMT of FIG. 4.
Figure 8:
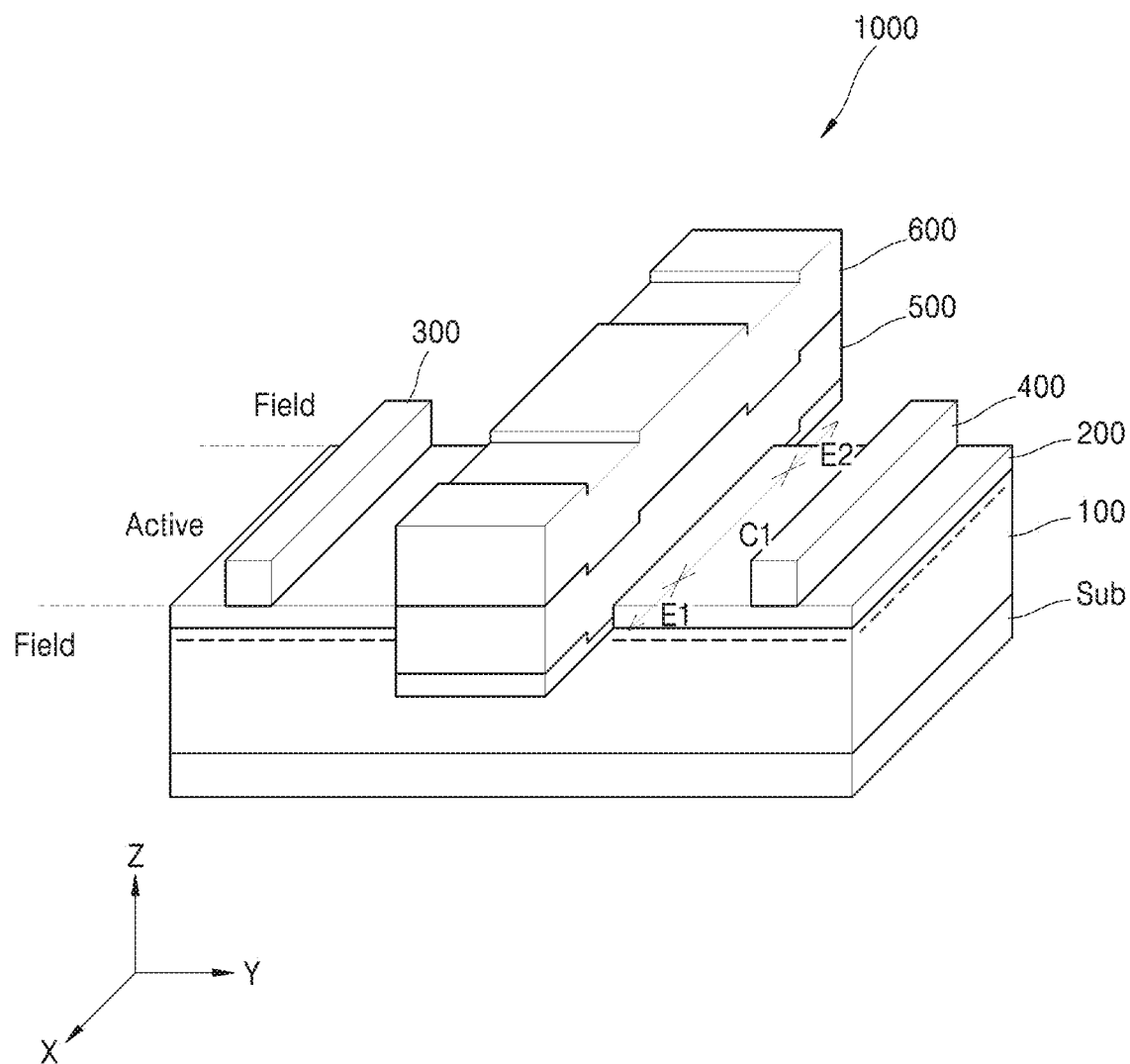
FIG. 8 is a schematic perspective view showing the configuration of the HEMT of FIG. 4.
Figure 9:
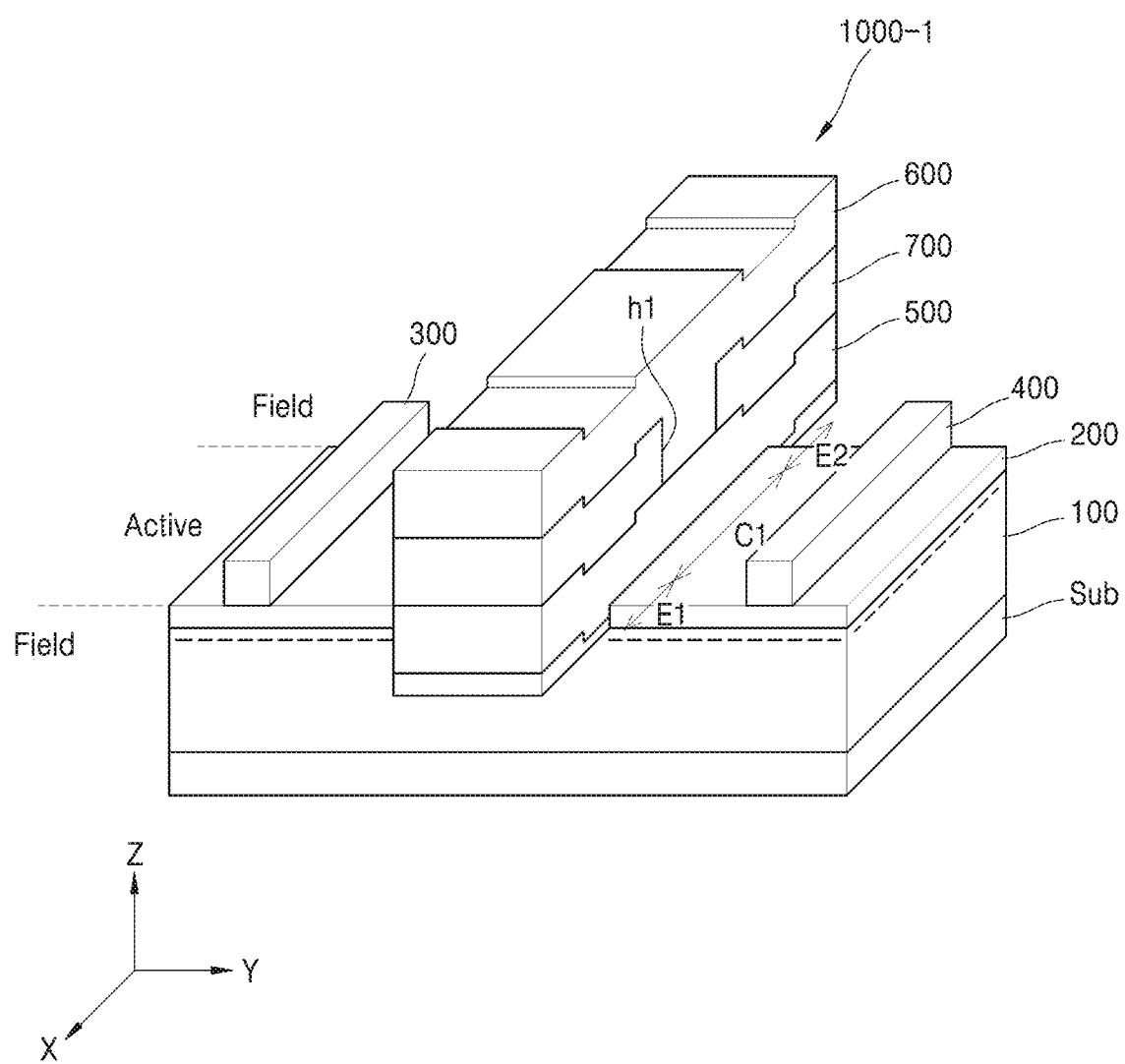
FIG. 9 is a schematic perspective view showing a configuration of an HEMT according to another embodiment.
Figure 10:
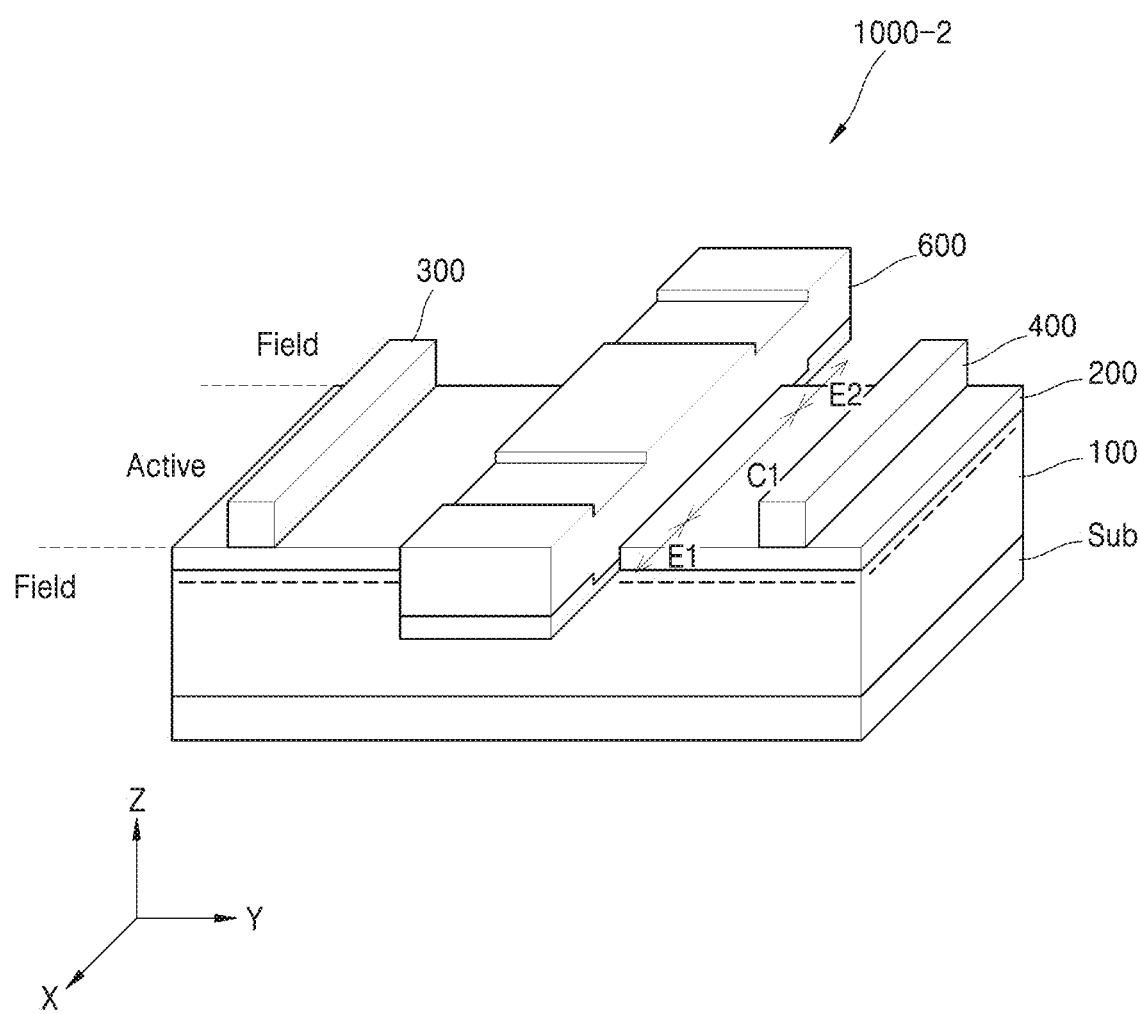
FIG. 10 is a schematic perspective view showing a configuration of an HEMT according to another embodiment.
Figure 11:
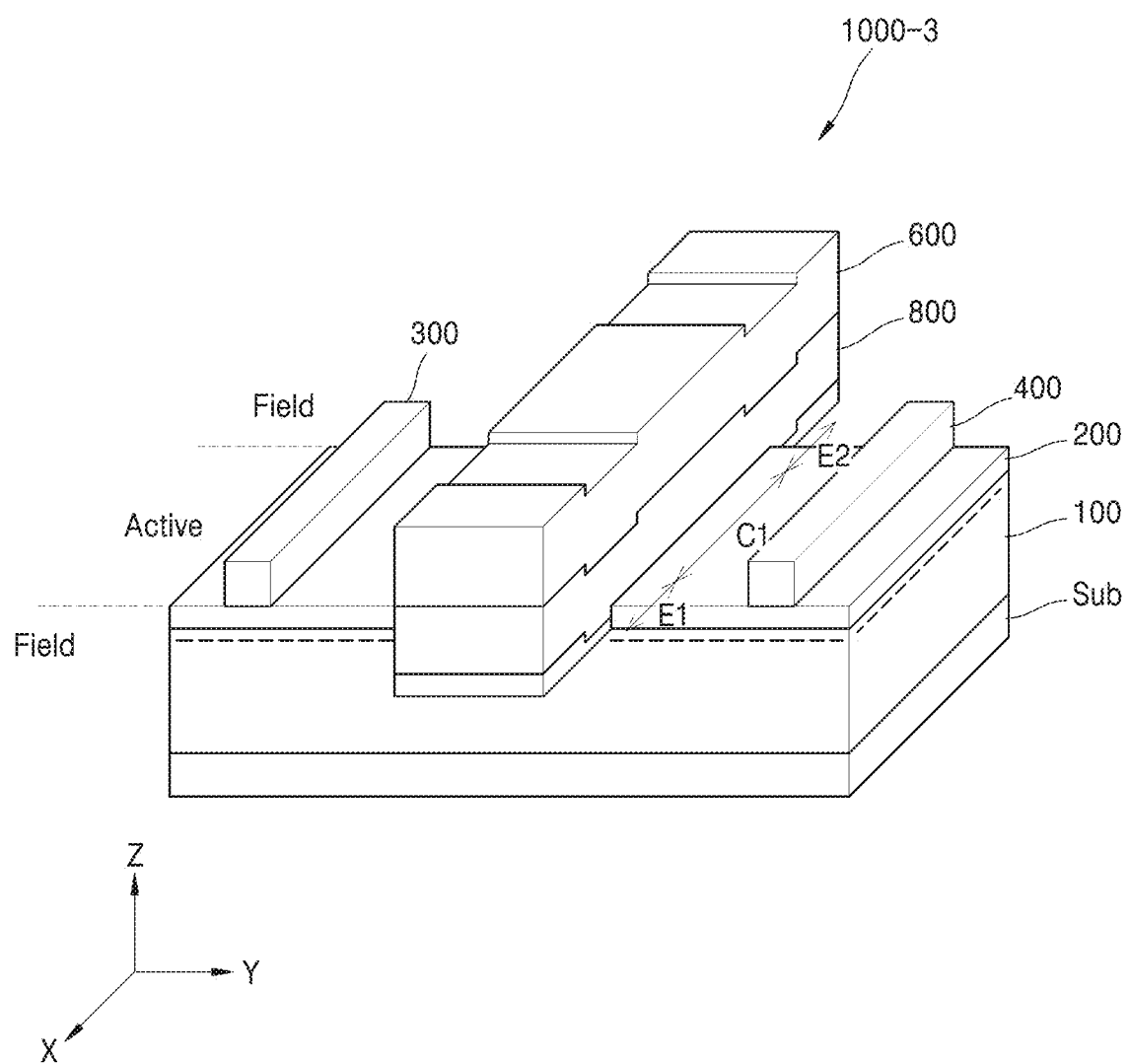
FIG. 11 is a schematic perspective view showing a configuration of an HEMT according to another embodiment.
Figure 12:
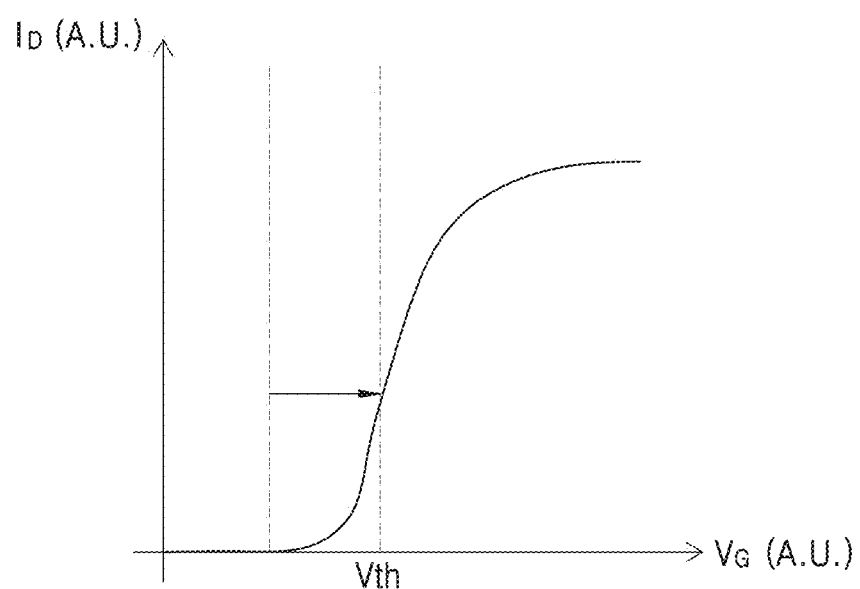
FIG. 12 is a graph schematically illustrating drain current and gate voltage characteristics of the HEMT of FIG. 8.

FIG. 7 is an exploded perspective view showing a simplified configuration of the HEMT 1000 of FIG. 4. FIG. 8 is a schematic perspective view showing the configuration of the HEMT 1000 of FIG. 4. FIG. 9 is a schematic perspective view showing a configuration of an HEMT 1000-1 according to another embodiment. FIG. 10 is a schematic perspective view showing a configuration of an HEMT 1000-2 according to another embodiment. FIG. 11 is a schematic perspective view showing a configuration of an HEMT 1000-3 according to another embodiment. FIG. 12 is a graph schematically illustrating drain current $I_D$ and gate voltage $V_G$ characteristics of the HEMT 1000 of FIG. 8.

In describing FIGS. 7 and 8, descriptions previously given with reference to FIGS. 4 to 6 will be omitted.

Referring to FIGS. 7 and 8, the depletion formation layer 500 and the gate electrode 600 may be formed by extending in a first direction (X-axis direction) parallel to the source electrode 300 and the drain electrode 400. The depletion formation layer 500 and the gate electrode 600 may include protrusions P1 formed to extend in the first direction (X-axis direction) at both ends. The protrusions P1 may protrude in the first direction (X-axis direction) from the active area Active and cover the field region Field. Portions of the protrusions P1 may be provided in the first edge region E1 and the second edge region E2. Portions of the depletion formation layer 500 and the gate electrode 600 except for the protrusions P1 may be provided in the second region C1.

On the other hand, although not shown, one of the depletion formation layer 500 and the gate electrode 600 may not include the protrusions P1 formed to extend in the first direction (X-axis direction) at both ends.

Additional protrusions that may be inserted into the first recess R1 and the second recess R2 may be formed respectively in the first edge region E1 and the second edge region E2 of a lower surface of the depletion formation layer 500. In addition, recesses corresponding to the first recess R1 and the second recess R2 may be formed respectively in the first edge region E1 and the second edge region E2 of an upper surface of the depletion formation layer 500.

Additional protrusions that may be inserted into recesses formed in the upper surface of the depletion formation layer 500 may be formed respectively in the first edge region E1 and the second edge region E2 of a lower surface of the gate electrode 600. In addition, recesses corresponding to the first recess R1 and the second recess R2 may be formed respectively in the first edge region E1 and the second edge region E2 of the upper surface of the depletion formation layer 500.

The source electrode 300 and the drain electrode 400 may be provided on the active region Active. For example, the source electrode 300 and the drain electrode 400 may be formed so as not to cover the field region Field.

The barrier layer 200 may include second protrusions P2 formed to extend in the first direction (X-axis direction) to correspond to the protrusions P1 of the depletion formation layer 500 and the gate electrode 600. The second protrusions P2 may be formed to extend in the first direction (X-axis direction) at both ends of the barrier layer 200. The second protrusions P2 may protrude in the first direction (X-axis direction) from the active region Active and may extend over the field region Field. A portion of the second protrusions P2 may be provided in the first edge region E1 and the second edge region E2. The remaining portion of the barrier layer 200 except for the second protrusions P2 may be provided in the second region C1. In FIG. 7, it is depicted that the thickness of the second protrusions P2 is the same as that of the barrier layer 200 in the second region C1, but is not limited thereto. For example, the thickness of the second protrusions P2 may be the same as the thickness of the barrier layer 200 of the first edge region E1 and the second edge region E2. The first recess R1 and the second recess R2 may be provided in the first edge region E1 and the second edge region E2 of the barrier layer 200. The first recess R1 and the second recess R2 may be formed to cover both the active region Active and the field region Field. However, the present embodiment is not limited thereto, and the first recess R1 and the second recess R2 may be formed to cover only the active region Active or the field region Field.

The depth t1 of the first recess R1 and the second recess R2 may be less than the thickness of the barrier layer 200. However, the present embodiment is not limited thereto, and the depth t1 of the first recess R1 and the second recess R2 may be the same as the thickness of the barrier layer 200. A width w1 of the first recess R1 and the second recess R2 in the second direction (Y-axis direction) may be the same as a width in the second direction (Y-axis direction) of the depletion formation layer 500 and the gate electrode 600. However, the present embodiment is not limited thereto, and the width w1 of the first recess R1 and the second recess R2 in the second direction (Y-axis direction) may be different from a width in the second direction (Y-axis direction) of the depletion formation layer 500 and the gate electrode 600. Edges having a length w2 in the first direction (X-axis direction) of the first recess R1 and the second recess R2 may be symmetrical with respect to an interface between the active region Active and the field region Field. However, the present embodiment is not limited thereto, and the edges having a length w2 in the first direction (X-axis direction) of the first recess R1 and the second recess R2 may be asymmetrical with respect to the interface between the active region Active and the field region Field.

Referring to FIG. 9, when compared with the HEMT 1000 of FIG. 8, the HEMT 1000-1 may further include an insulating film 700 between the depletion formation layer 500 and the gate electrode 600. A hole h1 may be formed in a region of the insulating layer 700. For example, the hole h1 formed through patterning may be provided in a region of the insulating layer 700. The gate electrode 600 may be provided to cover the hole h1. Accordingly, the gate electrode 600 and the depletion formation layer 500 may be formed to contact each other through the hole h1. The insulating film 700 may include, for example, silicon oxide. However, the present embodiment is not limited thereto, and the insulating layer 700 may include various insulating materials.

Referring to FIG. 10, when compared with the HEMT 1000 of FIG. 8, the HEMT 1000-2 may not include the depletion formation layer 500 between the barrier layer 200 and the gate electrode 600. For example, the gate electrode 600 may be provided to directly contact the barrier layer 200.

Referring to FIG. 11, when compared with the high electron mobility transistor 1000-2 of FIG. 10, the HEMT 1000-3 may further include an insulating film 800 between the barrier layer 200 and the gate electrode 600. For example, the gate electrode 600 may be provided on the insulating layer 800 formed on the barrier layer 200. The insulating layer 800 may electrically insulate the barrier layer 200 and the gate electrode 600 from each other.

Referring to FIG. 12, a hump may not be formed in a characteristic graphs of a drain current ID and a gate voltage $V_G$ of the HEMT 1000. As described above, a non-uniform distribution of gate electric field may occur between the first and second edge regions E1 and E2 and the second region C1 due to a gate edge effect. However, when the same threshold voltage $V_{th}$ is applied to the gate electrode 600, a channel may be simultaneously formed in the first and second edge regions E1 and E2 and the second region C1 of the channel layer 100, by a difference in concentration of 2DEG G1 in the channel layer 100 due to the non-uniform thickness according to regions of the barrier layer 200.

Figure 13:
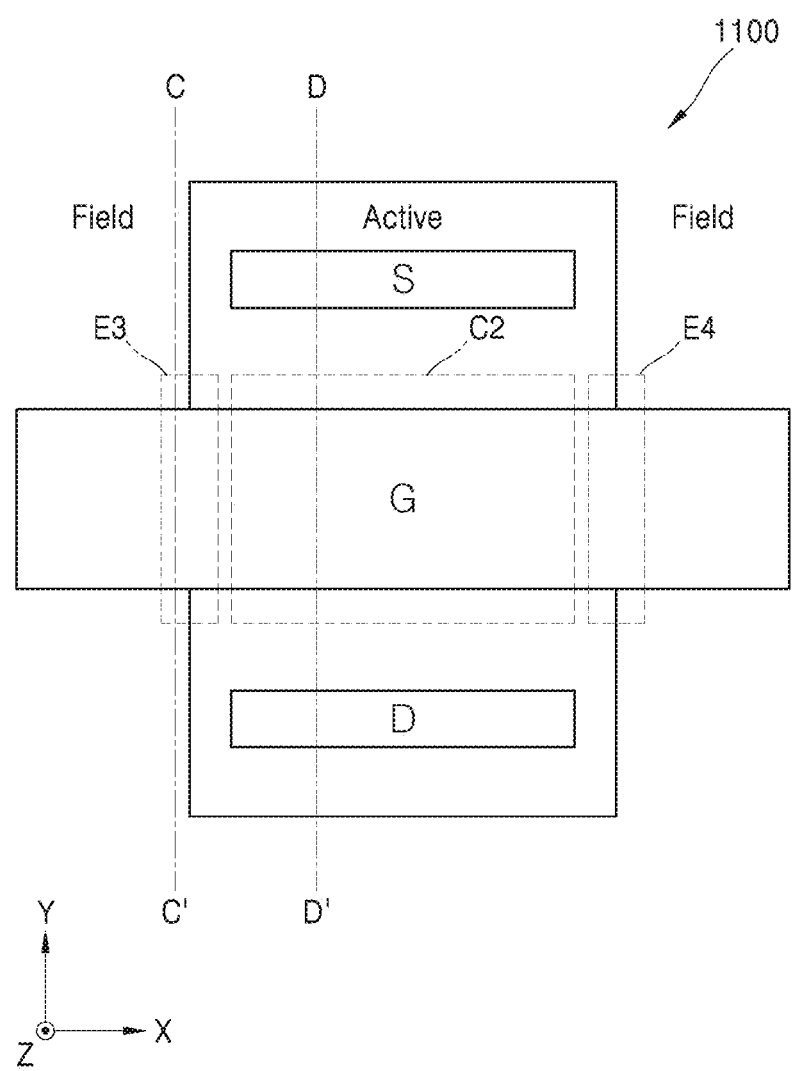
FIG. 13 is a schematic plan view showing a configuration of an HEMT according to another embodiment.
Figure 14:
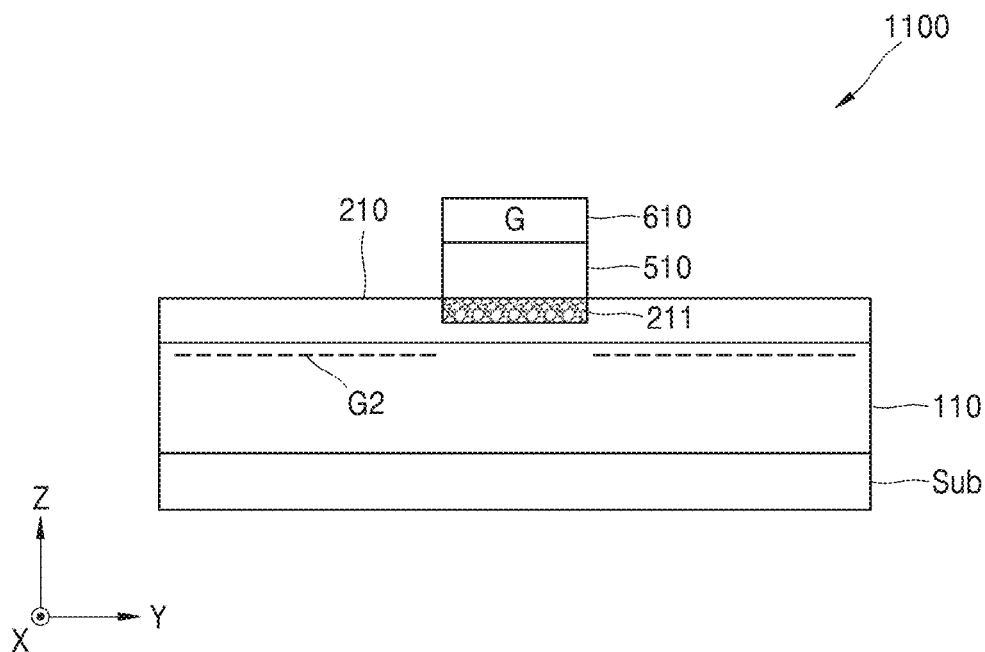
FIG. 14 is a brief side cross-sectional view taken along line C-C' of FIG. 13 showing a configuration of a side cross-section of the HEMT of FIG. 13.
Figure 15:
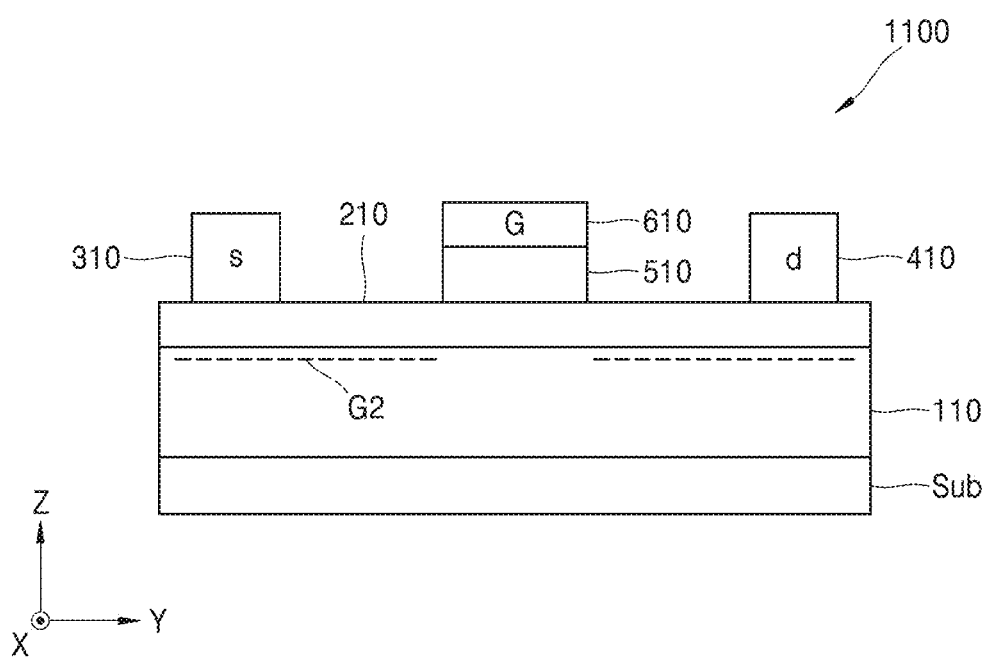
FIG. 15 is a brief side cross-sectional view taken along line D-D' of FIG. 13 showing a configuration of a side cross-section of the HEMT.

FIG. 13 is a schematic plan view showing a configuration of an HEMT 1100 according to another embodiment. FIG. 14 is a brief side cross-sectional view taken along line C-C' of FIG. 13 showing a configuration of a side cross-section of the HEMT 1100 of FIG. 13. FIG. 15 is a brief side cross-sectional view taken along line D-D' of FIG. 13 showing a configuration of a side cross-section of the HEMT 1100 of FIG. 13. In describing FIGS. 13 to 15, descriptions previously given with reference to FIGS. 4 to 8 will be omitted.

Referring to FIG. 13, the HEMT 1100 may include a gate electrode G provided on an active region Active surrounded by a field region Field. Also, the HEMT 1100 may include a source electrode S and a drain electrode D separated from each other with the gate electrode G therebetween on the active region Active. For example, the source electrode S, the drain electrode D, and the gate electrode G may all be formed to extend parallel to each other in the first direction (X-axis direction). Also, the source electrode S, the drain electrode D, and the gate electrode G may be sequentially arranged in the second direction (Y-axis direction). For example, the source electrode S and the drain electrode D may be separated from each other in the second direction (Y-axis direction) with the gate electrode G therebetween.

The gate electrode G may be formed to extend in the first direction (X-axis direction) and protrude into the field region Field. For example, the gate electrode G may include protrusions at both ends invading the field region Field by protruding from the active area Active in the first direction (X-axis direction). In this case, a region where a portion of the gate electrode G is disposed in a desired and/or alternatively predetermined region including an interface between the active region Active and the field region Field may be referred to as first regions E3 and E4. The first regions E3 and E4 may include a first edge region E3 and a second edge region E4.

The first edge region E3 and the second edge region E4 may be regions corresponding to both ends of a surface of the active region Active contacting the gate electrode G in the first direction (X-axis direction). As described later, a channel layer may be provided in the active region Active. Accordingly, the first edge region E3 and the second edge region E4 may be regions corresponding to both ends of a surface of the gate electrode G contacting the channel layer in the first direction (X-axis direction). A region where another part of the gate electrode G is disposed in a region between the first edge region E3 and the second edge region E4 may be referred to as a second region C2. The second region C2 may be referred to as a central region.

Referring to FIGS. 14 and 15, the HEMT 1100 may include a channel layer 110 including a 2DEG G2, a barrier layer 210 provided on the channel layer 110, source and drain electrodes 310 and 410 provided on the barrier layer 210, a depletion formation layer 510 that is configured to form a depletion region in the 2DEG G2 and provided on the barrier layer 210 between source and drain electrodes 310 and 410, and a gate electrode 610 provided on the depletion formation layer 510. However, the present embodiment is not limited thereto, and in some cases, the HEMT 1100 may not include the depletion formation layer 510. In this case, the gate electrode 610 may be provided to directly contact the barrier layer 210.

The barrier layer 210 may be a semiconductor layer different from the channel layer 110. The barrier layer 210 may be a layer that is configured to induce a 2DEG G2 in the channel layer 110. The 2DEG G2 may be formed in a portion of the channel layer 110 below an interface between the channel layer 110 and the barrier layer 210. The barrier layer 210 may have a thickness of tens of nm or less. For example, the barrier layer 210 may have a thickness of about 50 nm or less.

Also, the barrier layer 210 may include first edge regions E3 and E4 (refer to FIG. 13) that is configured to induce a 2DEG G2 of a first density in some regions of the channel layer 110 and a second region C2 (refer to FIG. 13) that is configured to induce a 2DEG G2 of a second density in some remaining regions of the channel layer 110, the second density being different from the first density. For example, the first regions E1 and E2 of the barrier layer 210 may be impurity-doped regions. On the other hand, the second region C2 of the barrier layer 210 may be an undoped region. For example, the first edge region E3 and the second edge region E4 may be regions doped with anions. The anion may include fluorine ions (F⁻). However, the present embodiment is not limited thereto, and the first edge region E3 and the second edge region E4 of the barrier layer 210 may be doped with other anions instead of fluorine ions (F⁻). For example, the anion may include oxygen ions (O2⁻).

Referring to FIGS. 13 and 14, the barrier layer 210 may include impurity-doped regions 211 formed in the first regions E1 and E2. For example, the impurity-doped regions 211 may be provided in each of the first edge region E3 and the second edge region E4. The depth of the impurity-doped regions 211 may be equal to or less than the thickness of the barrier layer 200.

Referring to FIGS. 13 and 15, the second region C2 of the barrier layer 210 may be a region undoped with an impurity. In other words, an impurity-doped region may not be provided in the second region C2 of the barrier layer 210. However, the present embodiment is not limited thereto, and an impurity-doped region may be formed in some regions of the second region C2.

In this way, the barrier layer 210 includes the first regions E3 and E4 doped with an impurity and the second region C2 undoped with an impurity, and thus, the density of 2DEG G2 formed in the channel layer 110 may be non-uniform. For example, the first density of 2DEG G2 of the first regions E3 and E4 may be less than the second density of 2DEG G2 of the second region C2 of the channel layer 110. This is because the impurity-doped regions 211 of the channel layer 110 control an energy band gap in the first regions E3 and E4 of the channel layer 110. Furthermore, as described above, when an impurity-doped region is formed in some regions of the second region C2, 2DEG G2 having different densities may be formed according to regions in the second region C2.

FIGS. 16 to 19 schematically illustrate a method of manufacturing an HEMT 1200 according to an embodiment. In describing FIGS. 16 to 19, descriptions previously given with reference to FIGS. 4 to 8 will be omitted. The HEMT 1200 of FIG. 19 may be substantially the same as the HEMT 1000 of FIG. 4.

Figure 16:
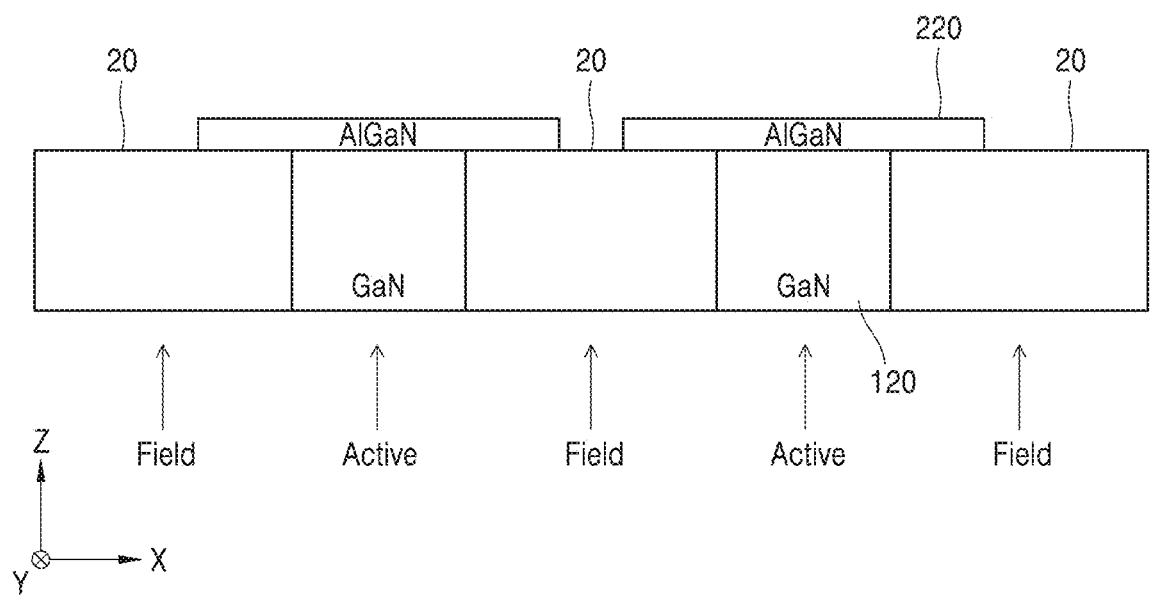
FIGS. 16 to 19 briefly show a method of manufacturing an HEMT according to an embodiment.

Referring to FIG. 16, a plurality of active regions Active surrounded by field regions Field may be formed. For example, a field region Field may be formed by etching a part of a channel layer 120 and filling the etched region with an insulating layer 20. At this point, the non-etched regions of the channel layer 120 may be active regions Active. However, the present embodiment is not limited thereto, and the field regions Field may be regions formed in the channel layer 120 through an argon (Ar) gas or nitrogen (N) gas treatment performed to some regions of the channel layer 120. For example, the channel layer 120 may include GaN. Also, a barrier layer 220 may be formed on the channel layer 120. For example, the barrier layer 220 may include AlGaN.

Figure 17:
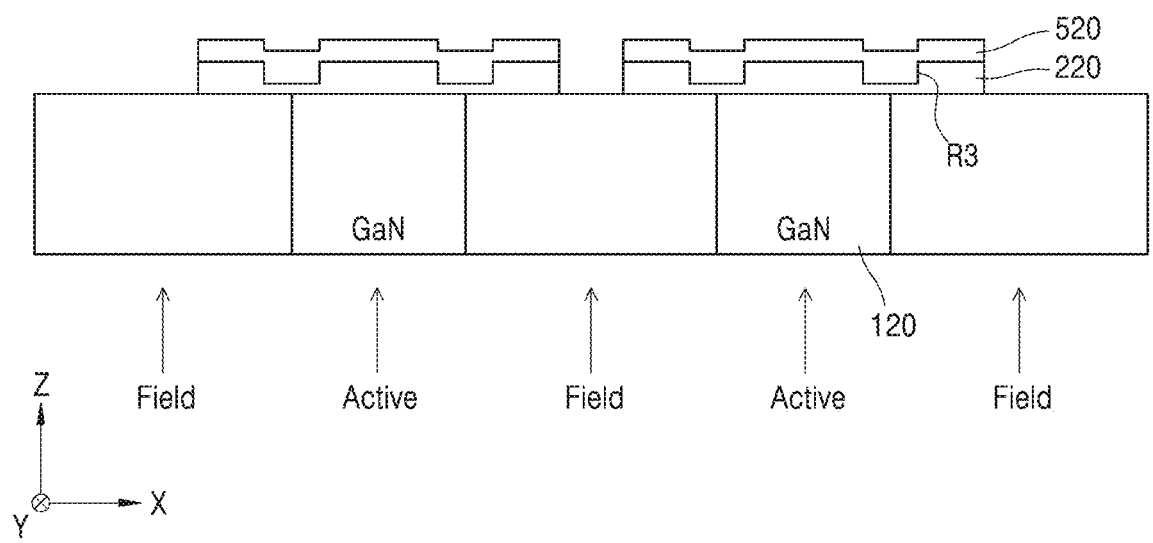
Figure 19:
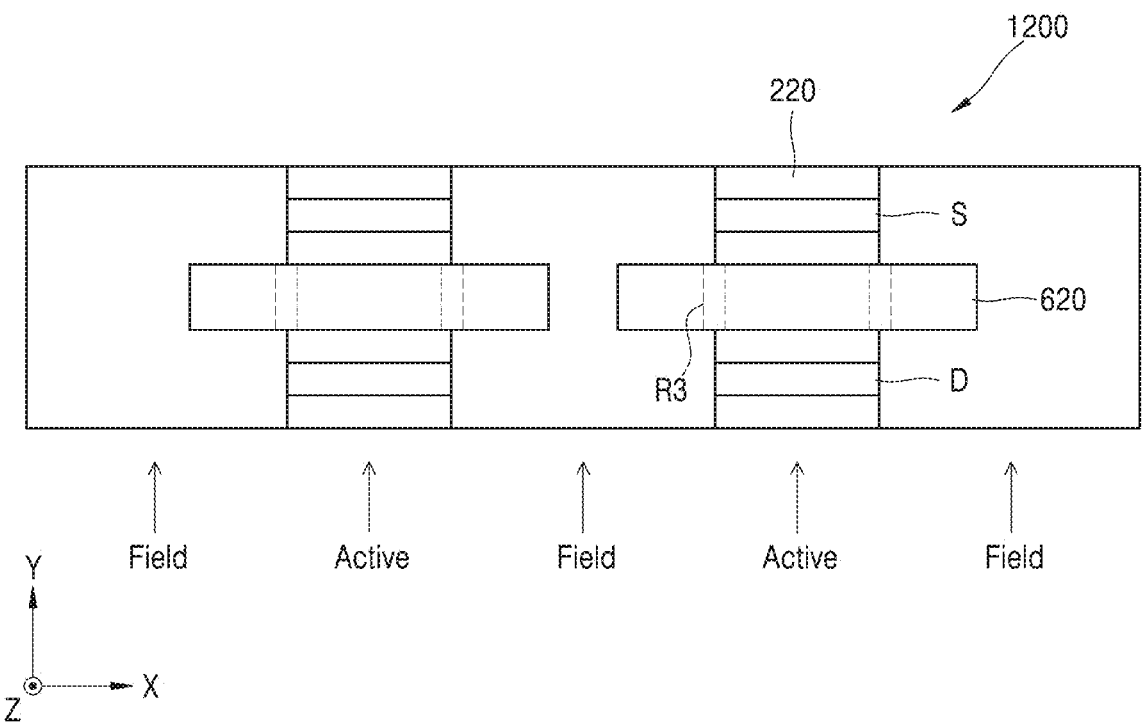

Referring to FIG. 17, recesses R3 may be formed in edge regions of the barrier layer 220. The edge regions may be both ends of a surface of the barrier layer 220 contacting the channel layer 120 in the first direction (X-axis direction). The recess R3 may be formed by etching a part of the barrier layer 220. The edge regions may be referred to as first regions. A depletion formation layer 520 may be formed on the barrier layer 220 to cover the recess R3. Lengths of the barrier layer 220 and the depletion formation layer 520 in the second direction (Y-axis direction) may be different from each other. The length of a portion of the barrier layer 220 and the depletion formation layer 520 in the first direction (X-axis direction) may be the same. As depicted in FIG. 19, the length of the barrier layer 220 in the first direction (X-axis direction) in regions other than the edge regions where the recesses R3 are formed may be less than that of the depletion formation layer 520 in the first direction (X-axis direction). Between the edge regions, a region where the depletion formation layer 520 is formed may be referred to as a second region. Furthermore, although not shown in FIG. 17, a recess R3 may be further formed between the edge regions of the barrier layer 220, that is, in a region of the second region.

Figure 18:
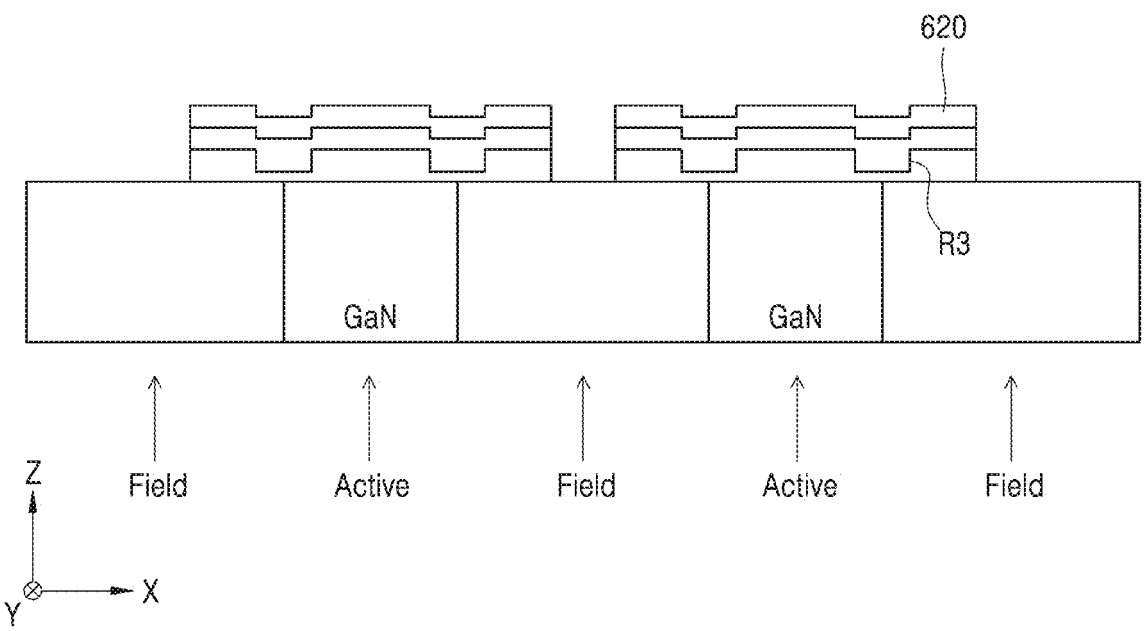

Referring to FIG. 18, a gate electrode 620 may be formed on the depletion formation layer 520. The depletion formation layer 520 and the gate electrode 620 may have the same length in the first direction X.

Referring to FIG. 19, a source electrode S and a drain electrode D may be formed on the barrier layer 220. The source electrode S and the drain electrode D may face each other with the depletion formation layer 520 therebetween. Accordingly, the source electrode S and the drain electrode D may be separated from each other in the second direction (Y-axis direction) with the depletion formation layer 520 therebetween.

FIGS. 20 to 23 briefly show a method of manufacturing an HEMT 1300 according to another embodiment. In describing FIGS. 20 to 23, descriptions previously given with reference to FIGS. 4 to 19 will be omitted. The HEMT 1300 of FIG. 23 may be substantially the same as the HEMT 1100 of FIG. 13.

Figure 20:
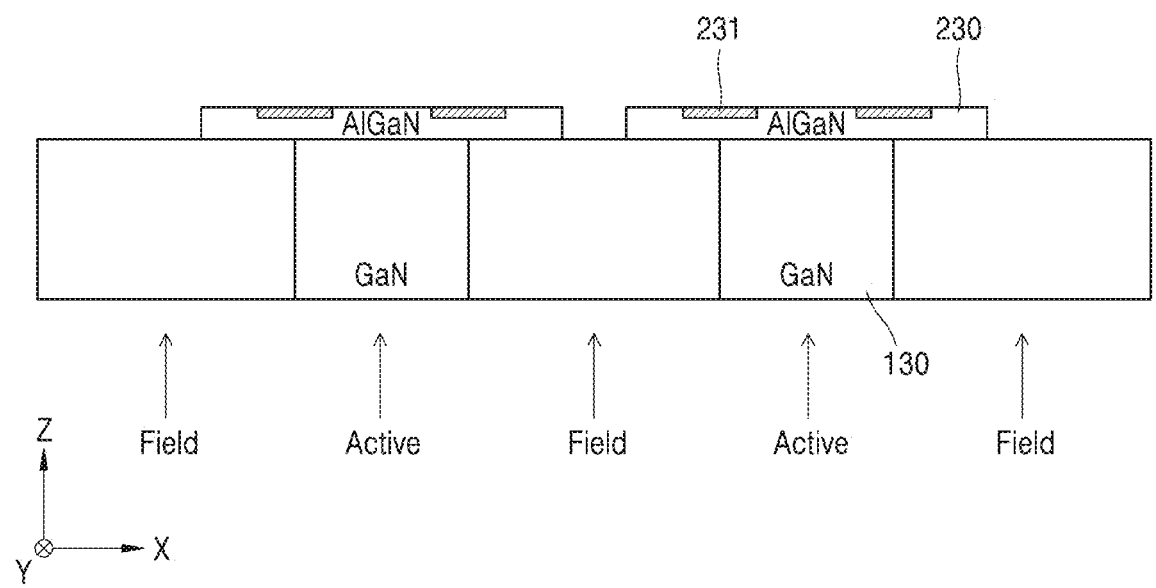
FIGS. 20 to 23 briefly show a method of manufacturing an HEMT according to another embodiment.

Referring to FIG. 20, a plurality of active regions Active surrounded by field regions Field may be formed. For example, a channel layer 130 may include GaN. In addition, a barrier layer 230 may be formed on the channel layer 130. For example, the barrier layer 230 may include AlGaN. Impurity-doped regions 231 may be formed in edge regions of the barrier layer 230. The edge regions may be both ends of a surface of the barrier layer 230 contacting the channel layer 130 in the first direction (X-axis direction). The impurity-doped regions 231 may be formed by doping the barrier layer 230 with an anion. The edge regions may be referred to as first regions. For example, the impurity-doped region 231 may be formed by doping fluorine ions F— in the edge regions of the barrier layer 230.

Figure 21:
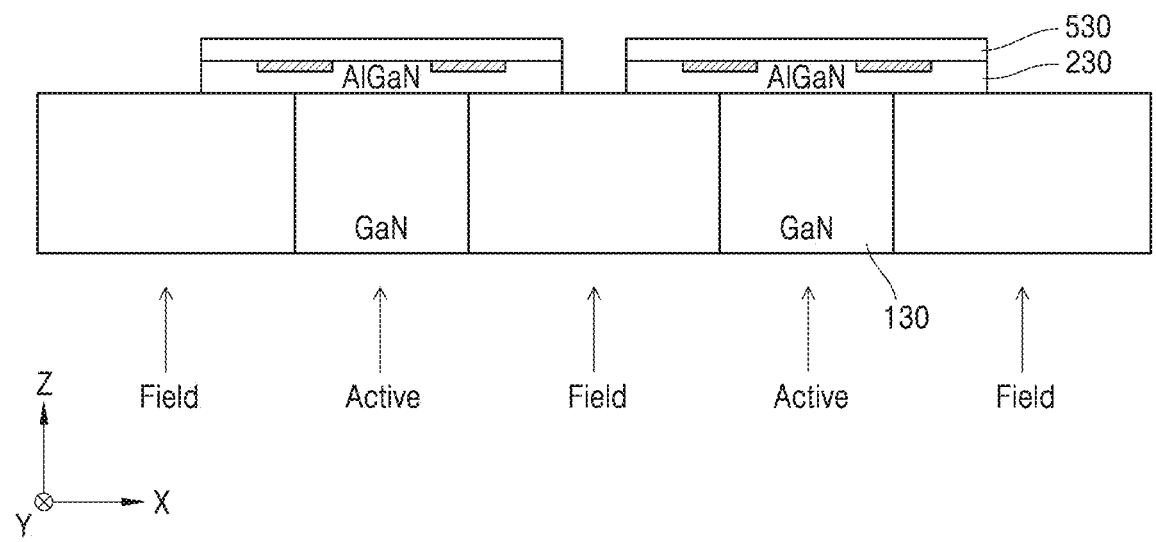

Referring to FIG. 21, a depletion formation layer 530 may be formed on the barrier layer 230. Lengths of the barrier layer 230 and the depletion formation layer 530 in the second direction (Y-axis direction) may be different from each other. The lengths of a portion of the barrier layer 230 and the depletion formation layer 530 in the first direction (X-axis direction) may be the same. As shown in FIG. 20, the length of the barrier layer 230 in the first direction (X-axis direction) in a region other than the edge regions in which the impurity-doped regions 231 are formed may be less than the length of the depletion formation layer 530 in the first direction (X-axis direction). Between the edge regions, a region where the depletion formation layer 530 is formed may be referred to as a second region. Furthermore, although not shown in FIG. 20, an impurity-doped region 231 may further be formed between the edge regions of the barrier layer 230, that is, a region of the second region.

Figure 22:
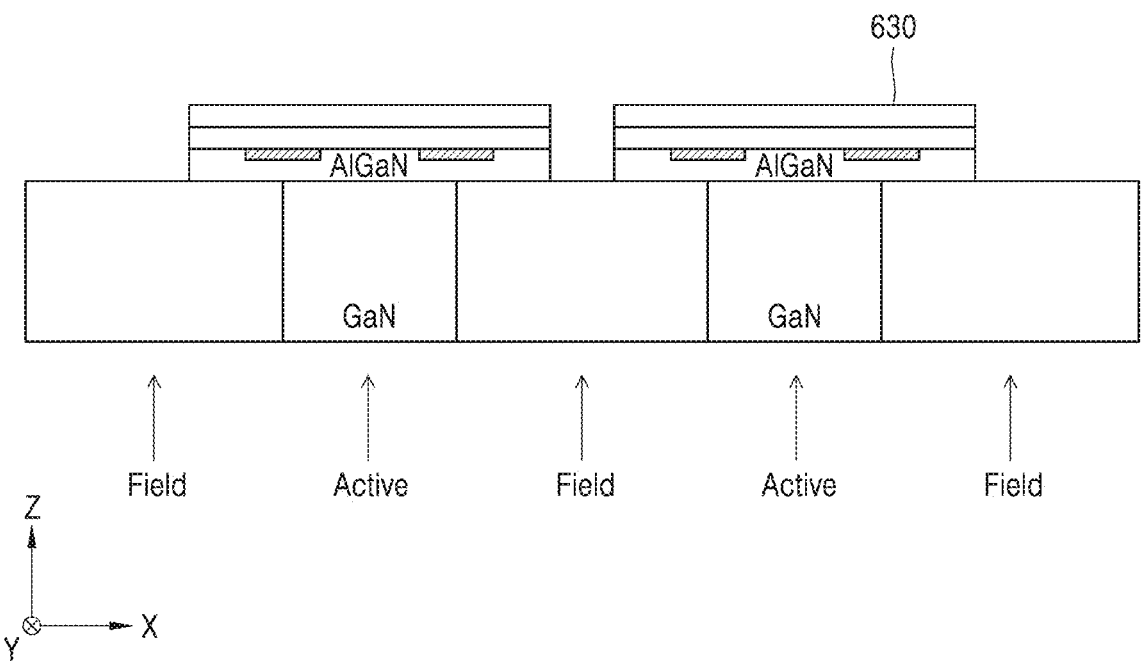

Referring to FIG. 22, a gate electrode 630 may be formed on the depletion formation layer 530. Lengths of the depletion formation layer 530 and the gate electrode 630 in the first direction X may be the same.

Figure 23:
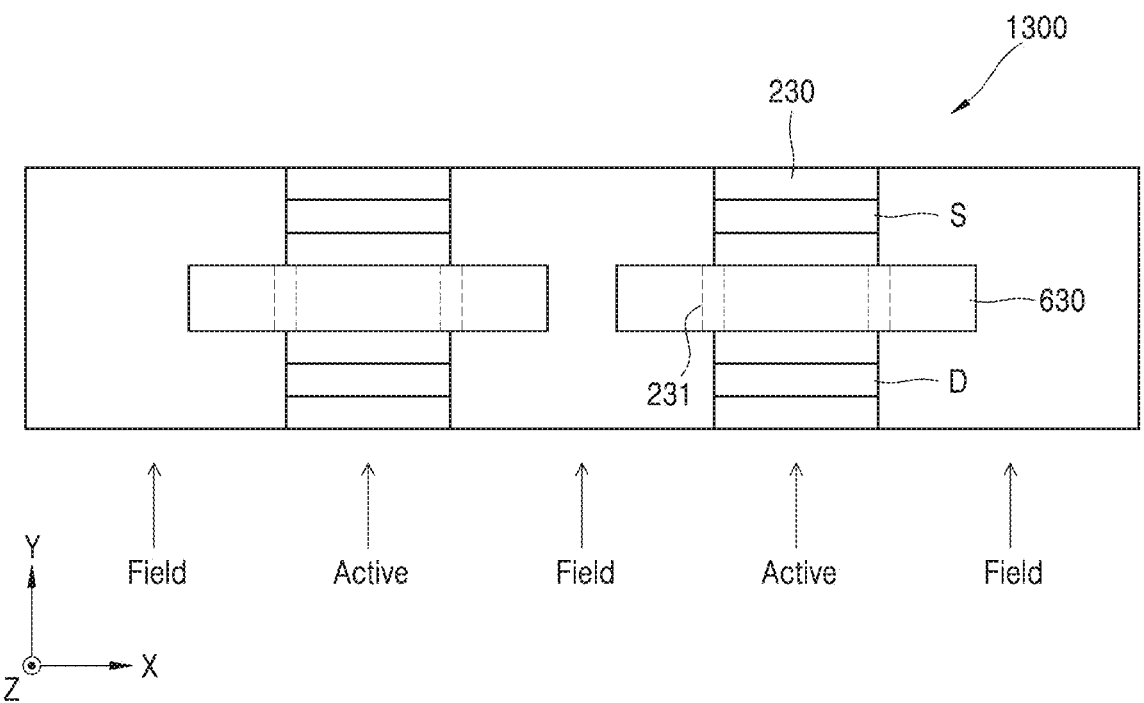

Referring to FIG. 23, a source electrode S and a drain electrode D may be formed on the barrier layer 230. The source electrode S and the drain electrode D may face each other with the depletion formation layer 530 therebetween. Accordingly, the source electrode S and the drain electrode D may be separated from each other in the second direction (Y-axis direction) with the depletion formation layer 530 therebetween.

The embodiments of the present disclosure provide an HEMT having a hump-free current-voltage characteristic.

The embodiments of the present disclosure provide a method of manufacturing an HEMT with improved current-voltage characteristics.

The embodiments of the present disclosure provide an HEMT having a characteristic in which channels are simultaneously formed in a central region and edge regions of a gate electrode at the same threshold voltage.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A high electron mobility transistor comprising:
a channel layer comprising a 2-dimensional electron gas (2DEG);
a barrier layer on the channel layer and comprising first regions and a second region, the first regions on portions of the channel layer and configured to induce the 2DEG of a first density in the portions of the channel layer, and the second region on other portions of the channel layer and configured to induce the 2DEG of a second density different from the first density in the other portions of the channel layer;
source and drain electrodes on the barrier layer; and
a gate electrode on the barrier layer between the source and drain electrodes,
the first regions including a first edge region and a second edge region opposite each other with the second region in between,
the first edge region and the second edge region corresponding respectively to both a first end and a second end of a surface of the channel layer crossing the gate electrode in plan view, wherein
the barrier layer includes recesses in the first edge region and the second edge region,
a thickness of the barrier layer in the recesses is greater than 0 nm and less than a thickness of the barrier layer in the second region,
a portion of the gate electrode vertically overlapping the recesses is closer to the surface of the channel layer than a part of the gate electrode over the second region of the barrier layer,
the second region is not recessed,
the source electrode and the drain electrode each have a longest dimension that extends parallel to each other in a first direction,
the gate electrode has a longest dimension that extends in the first direction parallel to the longest dimension of each of the source electrode and drain electrode, and the first edge region and the second edge region are separated from each other in the first direction by the second region.

2. The high electron mobility transistor of claim 1, wherein the first density of the 2DEG is less than the second density of the 2DEG.

3. The high electron mobility transistor of claim 1, further comprising:
an insulating film between the barrier layer and the gate electrode.

4. The high electron mobility transistor of claim 1, further comprising:
a depletion formation layer between the barrier layer and the gate electrode, wherein
the depletion formation layer is configured to form a depletion region in the 2DEG.

5. The high electron mobility transistor of claim 1, wherein the recesses have a depth greater than 0 nm and less than 100 nm.

6. The high electron mobility transistor of claim 1, wherein a depth of the recesses is the same as the thickness of the barrier layer in the recesses.

7. The high electron mobility transistor of claim 1, wherein the recesses have a width that is the same as a width of the gate electrode.

8. The high electron mobility transistor of claim 1, wherein a shape of the recesses is configured to simultaneously form a channel in a first region of the channel layer and a second region of the channel layer in response to applying a same threshold voltage to the gate electrode, the recesses overlap the first region of the channel layer in the plan view, and the second region of the channel layer overlaps the second region of the barrier layer in the plan view.

9. The high electron mobility transistor of claim 1, wherein the first edge region and the second edge region of the barrier layer are regions doped with anions.

10. The high electron mobility transistor of claim 9, wherein the anions comprise any one of fluorine ions $F^-$ and oxygen ions $O^{2-}$.

11. The high electron mobility transistor of claim 1, wherein the barrier layer comprises any one of AlGaN, AlInN, InGaN, AlN, and AlInGaN.

12. A high electron mobility transistor comprising:
a channel layer comprising a 2-dimensional electron gas (2DEC);
a barrier layer on the channel layer and comprising first regions and a second region, the first regions on portions of the channel layer and configured to induce the 2DEC of a first day density in the portions of the channel layer, and the second region on other portions of the channel layer and configured to induce the 2DEC of a second density different from the first density in the other portions of the channel layer;
source and drain electrodes on the barrier layer;
a gate electrode on the barrier layer between the source and drain electrodes; and
a depletion formation layer between the barrier layer and the gate electrode,
the first regions including a first edge region and a second edge region opposite each other with the second region in between,
the first edge region and the second edge region corresponding respectively to both a first end and a second end of a surface of the channel layer crossing the gate electrode in plan view, wherein
the barrier layer includes recesses in the first edge region and the second edge region, a thickness of the barrier layer in the recesses is greater than 0 nm and less than a thickness of the barrier layer in the second region, a portion of the gate electrode vertically overlapping the recesses is closer to the surface of the channel layer than a part of the gate electrode over the second region of the barrier layer, the depletion formation layer is configured to form a depletion region in the 2DEC, and the depletion formation layer comprises a p-type Group III-V nitride semiconductor.

13. The high electron mobility transistor of claim 12, wherein
the source and drain electrodes extend parallel to each other in a first direction, and
the gate electrode extends in the first direction parallel to the source and drain electrodes.

14. The high electron mobility transistor of claim 13, wherein, in the plan view, both ends of the gate electrode extend away from the channel layer in the first direction.

15. The high electron mobility transistor of claim 13, wherein
the gate electrode comprises protrusions at both ends thereof extending in the first direction.

16. The high electron mobility transistor of claim 15, wherein
the barrier layer comprises second protrusions extending in the first direction, and
the second protrusions correspond to the protrusions of the gate electrode.

17. A method of manufacturing a high electron mobility transistor comprising:
forming a barrier layer on a channel layer;
forming first regions and a second region of the barrier layer, the first regions configured to induce a 2DEG of a first density in portions of the channel layer and the second region configured to induce a 2DEG of a second density different from the first density in other portions of the channel layer;
forming source and drain electrodes on the barrier layer; and
forming a gate electrode on the barrier layer between the source and drain electrodes,
the first regions including a first edge region and a second edge region opposite each other with the second region in between, the first edge region and the second edge region corresponding respectively to both a first end and a second end of a surface of the channel layer crossing the gate electrode in plan view, wherein the forming the first regions and the second region on the barrier layer comprises forming recesses in the first edge region and the second edge region of the barrier layer such that a thickness of the barrier layer in the recesses is greater than 0 nm and less than a thickness of the barrier layer in the second region, the gate electrode is formed on the barrier layer so a portion of the gate electrode vertically overlapping the recesses is closer to the surface of the channel layer than a part of the gate electrode over the second region of the barrier layer, the second region is not recessed, the source electrode and the drain electrode each have a longest dimension that extends parallel to each other in a first direction, the gate electrode has a longest dimension that extends in the first direction parallel to the longest dimension of each of the source electrode and drain electrode, and the first edge region and the second edge region are separated from each other in the first direction by the second region.

18. The method of claim 17, further comprising:
forming an insulating film between the barrier layer and the gate electrode.

19. The method of claim 17, further comprising:
forming a depletion formation layer on the barrier layer to form a depletion region in the 2DEG in the barrier layer.

20. The method of claim 19, further comprising:
forming an insulating film on the depletion formation layer;
forming a hole in the insulating film by patterning portions of the insulating film; and
forming the gate electrode on the insulating film to cover the hole.

21. The method of claim 17, wherein the gate electrode, the source electrode, and drain electrode are formed to extend parallel to each other in a first direction.

22. The method of claim 21, wherein, in the plan view, both ends of the gate electrode extend away from the channel layer in the first direction.

23. The method of claim 17, wherein the forming the first regions and the second region on the barrier layer further comprises forming a recess in portions of the barrier layer between the first edge region and the second edge region.

24. The method of claim 17, wherein the forming the first regions and the second region on the barrier layer comprises doping anions at both ends of a surface of the gate electrode contacting the channel layer.

* * * * *